(12) United States Patent  
Kimura

(10) Patent No.: US 7,971,915 B2
(45) Date of Patent: Jul. 5, 2011

(54) NOZZLE UNIT

(75) Inventor: Akira Kimura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/458,044

(22) Filed: Jun. 30, 2009

(65) Prior Publication Data

US 2010/0011570 A1 Jan. 21, 2010

(30) Foreign Application Priority Data

Jul. 17, 2008 (JP) ................. 2008-186332

(51) Int. Cl.
*B25J 15/06* (2006.01)
(52) U.S. Cl. ............... 294/64.1; 29/743; 29/740; 294/2
(58) Field of Classification Search ............ 29/740–743, 29/834; 294/64.1, 64.2; 901/40; 414/572.1–572.2, 414/737
See application file for complete search history.

(56) References Cited

U.S. PATENT DOCUMENTS

| 6,195,878 | B1 * | 3/2001 | Hata et al. ................. 29/832 |
| 6,708,402 | B2 * | 3/2004 | Hirano et al. .............. 29/833 |
| 6,748,649 | B2 * | 6/2004 | Okuda et al. ............... 29/740 |
| 7,185,422 | B2 * | 3/2007 | Sakai et al. ................ 29/832 |
| 7,200,925 | B2 * | 4/2007 | Hata et al. ................. 29/832 |
| 7,222,901 | B2 * | 5/2007 | Gebauer et al. ............ 294/64.1 |
| 7,337,533 | B2 * | 3/2008 | Imafuku et al. ............ 29/739 |
| 7,340,827 | B2 | 3/2008 | Saito et al. |

FOREIGN PATENT DOCUMENTS

JP 2005-005415 1/2005

* cited by examiner

*Primary Examiner* — Minh Trinh
(74) *Attorney, Agent, or Firm* — Rader, Fishman & Grauer PLLC

(57) ABSTRACT

A nozzle unit includes a rotating body and a driving source. The rotating body includes a plurality of nozzles for holding a component using a negative pressure and rotates the plurality of nozzles. The driving source drives the rotating body in a non-contact state.

15 Claims, 29 Drawing Sheets

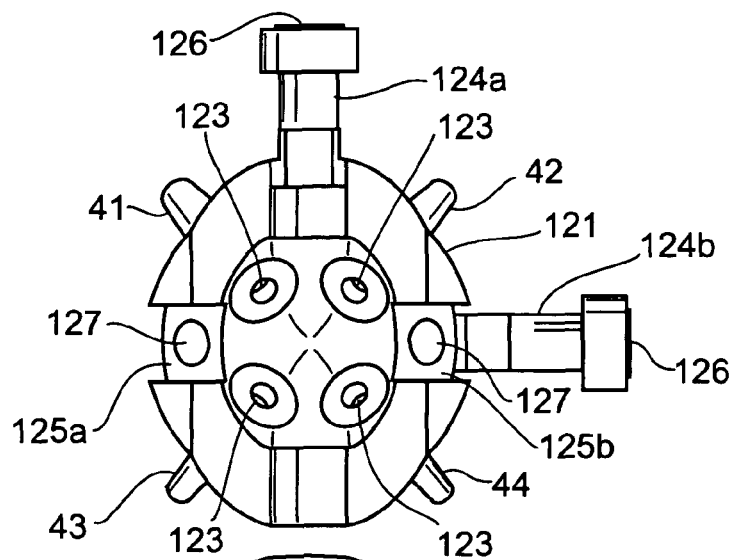
FIG.10A
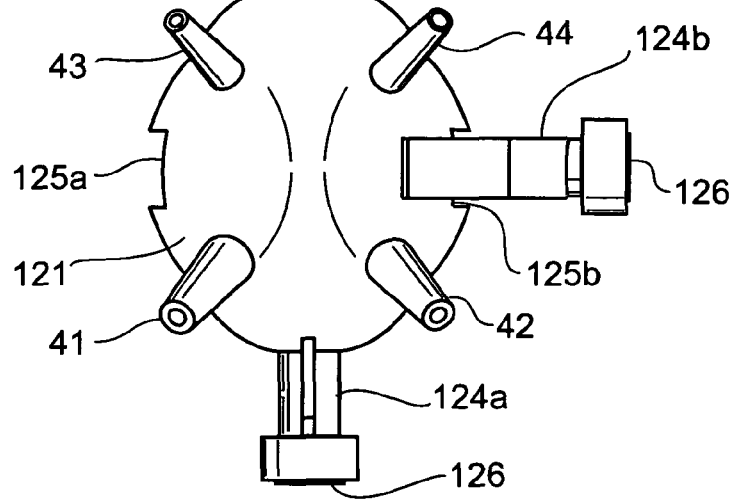
FIG.10B
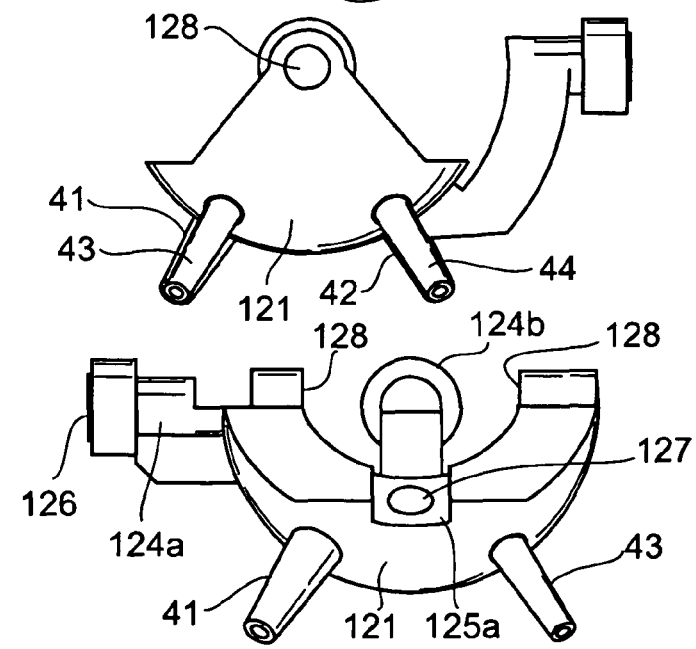
FIG.10C
FIG.10D

NOZZLE UNIT

BACKGROUND OF THE INVENTION

1. Field of the Invention

The present invention relates to a nozzle unit for holding an electronic component or other components and a component mounting apparatus that is equipped with the nozzle unit and mounts the component held by the nozzle unit on a substrate and the like.

2. Description of the Related Art

From the past, there has been a component mounting apparatus that includes a nozzle for sucking and holding minute components including electronic components using a negative pressure, and mounts the electronic components on a substrate.

As an example of the component mounting apparatus, there is disclosed a mounting apparatus including a head that moves in, for example, biaxial directions orthogonalized within a horizontal plane and includes a plurality of nozzles that each suck and hold a component. The plurality of nozzles include at least two types of nozzles for holding at least two types of components of different sizes (see, for example, Japanese Patent No. 3,981,834 (paragraph [0049], FIGS. 4 and 5)).

A different mounting apparatus includes a plurality of mounting heads connected to an endless belt, the plurality of mounting heads being moved within a horizontal plane by a drive of the endless belt. A single mounting head includes a plurality of mounting nozzles provided radially within a vertical plane perpendicular to the ground, and the plurality of mounting nozzles are rotatable about an axis in a horizontal direction (see, for example, Japanese Patent Application Laid-open No. 2005-5415 (paragraphs [0029] and [0042], FIGS. 1, 3, and 13); hereinafter, referred to as Patent Document 2).

In the component mounting apparatus disclosed in Patent Document 2, a concave portion (26) of a nozzle switching shaft (25) fits with a convex portion (33) provided at an end portion of a fulcrum pin (32) as shown in FIG. 13. The nozzle switching shaft (25) causes the fulcrum pin (32) to rotate. As a result, a plurality of mounting nozzles (31) rotate with the fulcrum pin (32) as a rotary shaft.

SUMMARY OF THE INVENTION

Since the nozzle switching shaft (25) causes the plurality of mounting nozzles (31) to rotate in the component mounting apparatus disclosed in Patent Document 2, a driving source having a complex mechanism such as a mechanism for bringing the nozzle switching shaft (25) close to and into contact with the convex portion (33) and a mechanism for rotating the nozzle switching shaft (25) has been required occasionally.

Moreover, there has been a possibility that dust is produced when the nozzle switching shaft (25) and the convex portion (33) are brought into contact with each other.

In view of the circumstances as described above, there is a need for a nozzle unit and a component mounting apparatus equipped with the nozzle unit, that do not require a driving source having a mechanically complex mechanism for driving nozzles and produce less dust.

According to an embodiment of the present invention, there is provided a nozzle unit including a rotating body and a driving source.

The rotating body includes a plurality of nozzles for holding a component using a negative pressure and rotates the plurality of nozzles.

The driving source drives the rotating body in a non-contact state.

Because the driving source drives the rotating body without being in contact therewith, a mechanically complex mechanism is hardly required and production of dust can be suppressed.

The rotating body may rotate the plurality of nozzles three-dimensionally. With this structure, the plurality of nozzles can be used more effectively than in a case where the plurality of nozzles are rotated two-dimensionally, for example.

The rotating body may include a first shaft, a first shell member capable of rotating about the first shaft, a second shaft in a direction different from that of the first shaft, and a second shell member that includes the plurality of nozzles and is capable of rotating about the second shaft, the second shell member being provided such that the second shell member covers the first shell member. With this structure, as compared to a case where a member including a plurality of nozzles is rotated by a spherical bearing, for example, positioning accuracy at a time of positioning the nozzles by rotating the rotating body by the driving source is improved.

The nozzle unit may further include a supplying channel for the negative pressure and a third shell member that includes a first opening for delivering the negative pressure to the first shell member and is connected to the supplying channel, the third shell member being provided such that the first shell member covers the third shell member. In this case, the first shell member may include a plurality of second openings to deliver the negative pressure to one of the plurality of nozzles of the second shell member by being switched selectively by the driving source so that one of the plurality of second openings faces the first opening.

A member constituting the first shaft described above only needs to be provided to the third shell member or the first shell member. Similarly, a member constituting the second shaft only needs to be provided to the first shell member or the second shell member.

The nozzle unit may further include a sealing member provided for enhancing, when one of the plurality of second openings faces the first opening, airtightness between the first opening and the second opening. With this structure, even when there is a gap between the third shell member and the first shell member so as to allow a relative movement, airtightness can be enhanced while reducing energy for generating the negative pressure.

Similarly, the nozzle unit may further include a sealing member provided for enhancing, when one of the plurality of second openings faces one of the plurality of nozzles, airtightness between the second opening and the nozzle.

The second shell member may include a first driven portion driven by the driving source so that the second shell member rotates about the first shaft, and a second driven portion driven by the driving source so that the second shell member rotates about the second shaft. With this structure, by driving the second shell member, the driving source can rotate the rotating body without driving the first shell member.

At least one of the first shell member and the second shell member may include a stopper to restrict, when the plurality of nozzles are positioned by the driving source, a relative movement of the first shell member and the second shell member. With this structure, positioning accuracy of the nozzles can be additionally improved.

The stopper may be an engaging portion to engage the first shell member and the second shell member with each other. Alternatively, the stopper may be an engaging portion to engage the third shell member and the first shell member with each other.

The stopper may include a magnetic body that causes a suction force to act on the first shell member and the second shell member. Alternatively, the stopper may include a magnetic body that causes a suction force to act on the third shell member and the first shell member. The magnetic body may be a permanent magnet or an unmagnetized magnetic body. The magnetic body may be provided to the engaging portion.

The nozzle unit may further include a supplying channel for the negative pressure and a third shell member connected to the supplying channel and provided such that the first shell member covers the third shell member. In this case, at least one of the third shell member and the first shell member may include a stopper to restrict a movement of the first shell member with respect to the third shell member when the plurality of nozzles are positioned by the driving source.

The engaging portion may include a first engaging protrusion that is provided to the first shell member and extends in a direction of the first shaft, and an engaging groove that is provided to the second shell member and engages with the first engaging protrusion. Specifically, a member constituting the first shaft as a rotary shaft of the first shell member or a part of the first shell member connected to the member constituting the first shaft is used as the protrusion (first engaging protrusion) that engages with the engaging groove of the second shell member. With this structure, a size reduction of the nozzle unit can be realized.

The driving source may use a magnetism to drive the rotating body in the non-contact state, or drive the rotating body by other driving methods.

The rotating body may include a magnetic body. In this case, the driving source may drive the rotating body by causing a magnetic field that acts on the magnetic body. With this structure, the driving source can rotate the rotating body with a simple mechanism and high responsiveness.

The rotating body may rotate the plurality of nozzles two-dimensionally. In this case, a direction of the rotary shaft of the rotating body may be any of various directions including a vertical direction, a horizontal direction, and an oblique direction.

According to an embodiment of the present invention, there is provided a component mounting apparatus including a plurality of nozzle units, a head, and a moving mechanism.

The plurality of nozzle units each include a rotating body that includes a plurality of nozzles for holding a component using a negative pressure and rotates the plurality of nozzles, and a driving source to drive the rotating body in a non-contact state.

The head is connected with the plurality of nozzle units.

The moving mechanism moves the head.

In the component mounting apparatus according to the embodiment of the present invention, the head is connected with the plurality of nozzle units, and a size of each of the nozzle units is required to be relatively small. With this structure, a merit of the driving source being a non-contact type increases.

According to an embodiment of the present invention, there is provided a nozzle unit including a rotating body and a driving source.

The rotating body includes a plurality of nozzles for holding a component using a negative pressure and rotates the plurality of nozzles.

The driving source rotates the rotating body three-dimensionally.

According to an embodiment of the present invention, there is provided a nozzle unit including a plurality of nozzles, a driving source, and a supporting portion.

The plurality of nozzles each hold a component using a negative pressure.

The driving source drives one of the plurality of nozzles in a non-contact state.

The supporting portion supports the plurality of nozzles so that the plurality of nozzles can be driven by the driving source.

As described above, according to the embodiments of the present invention, a driving source having a mechanically complex mechanism for driving nozzles is not required, and production of dust can be suppressed.

These and other objects, features and advantages of the present invention will become more apparent in light of the following detailed description of best mode embodiments thereof, as illustrated in the accompanying drawings.

BRIEF DESCRIPTION OF DRAWINGS

FIGS. 10A to 10D are diagrams showing the second shell member, FIG. 10A being a plan view thereof, FIG. 10B being a bottom view thereof, FIG. 10C being a side view thereof seen from a rotary-shaft portion side, FIG. 10D being a side view thereof seen from an engaging groove side;

DESCRIPTION OF PREFERRED EMBODIMENTS

Figure 1:
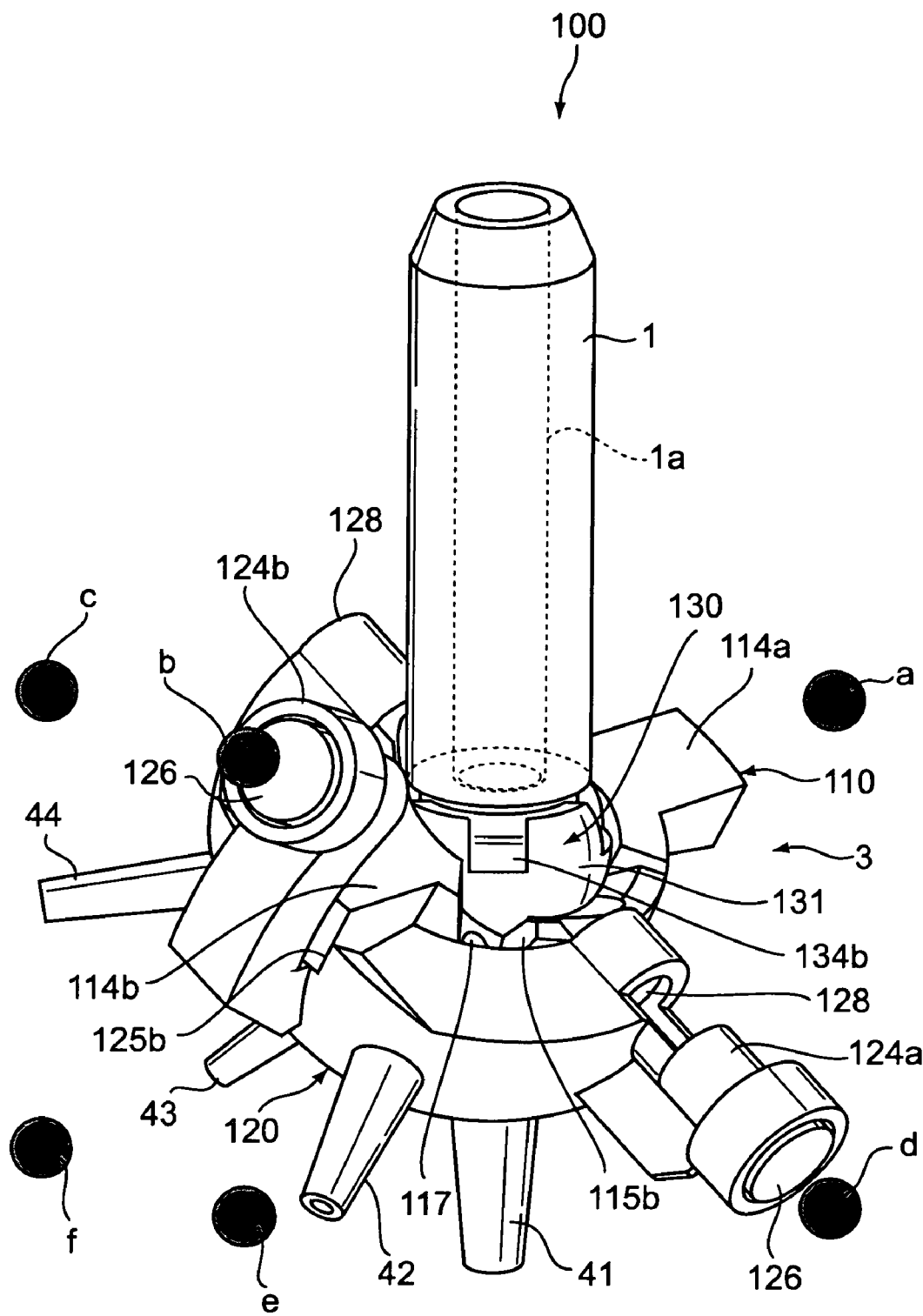
FIG. 1 is a perspective view of a nozzle unit according to an embodiment of the present invention, and shows a state where a first nozzle is positioned in a vertical direction.
Figure 2:
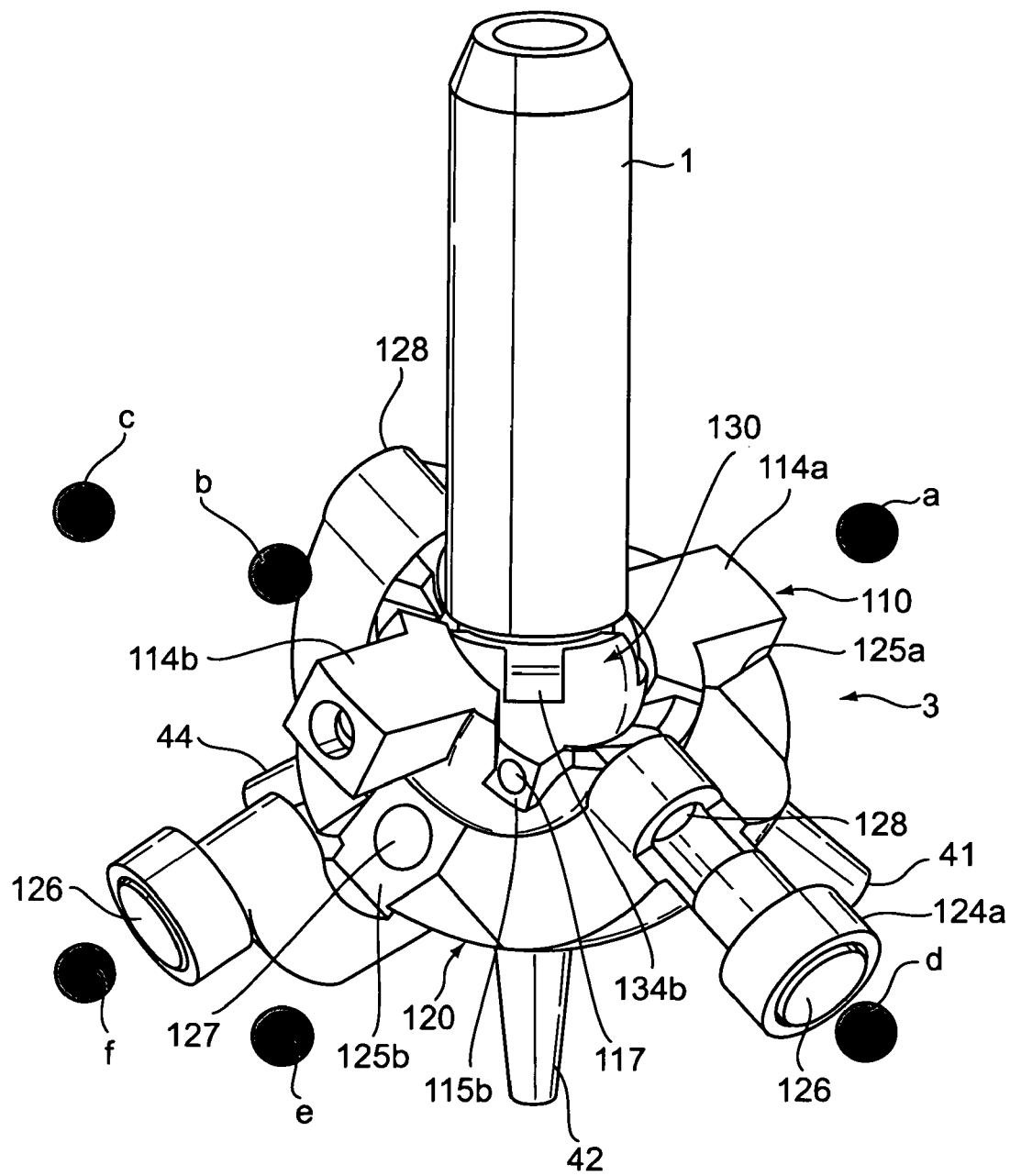
FIG. 2 is a perspective view of the nozzle unit shown in FIG. 1, and shows a state where a second nozzle is positioned in the vertical direction.
Figure 3:
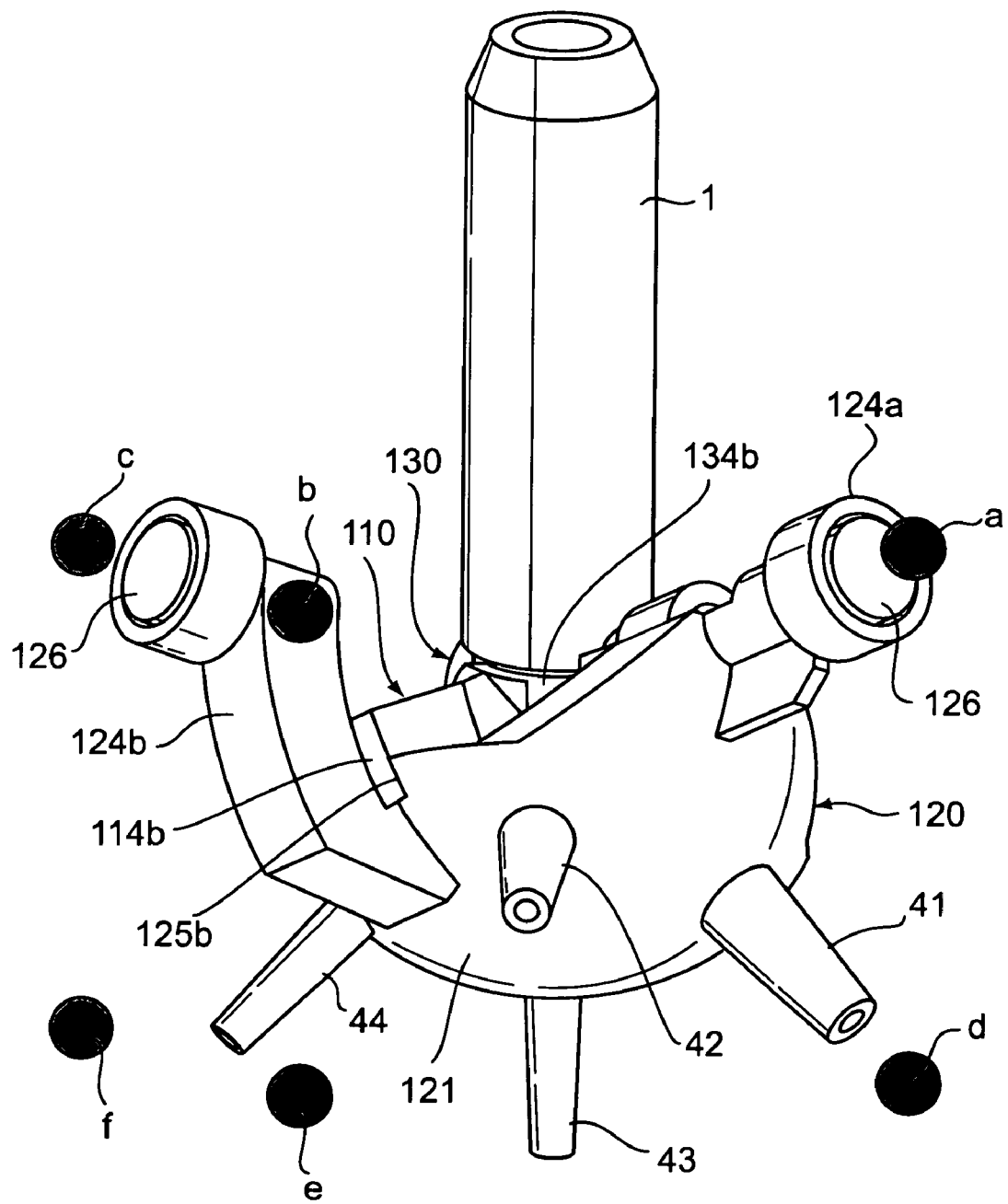
FIG. 3 is a perspective view of the nozzle unit shown in FIG. 1, and shows a state where a third nozzle is positioned in the vertical direction.
Figure 4:
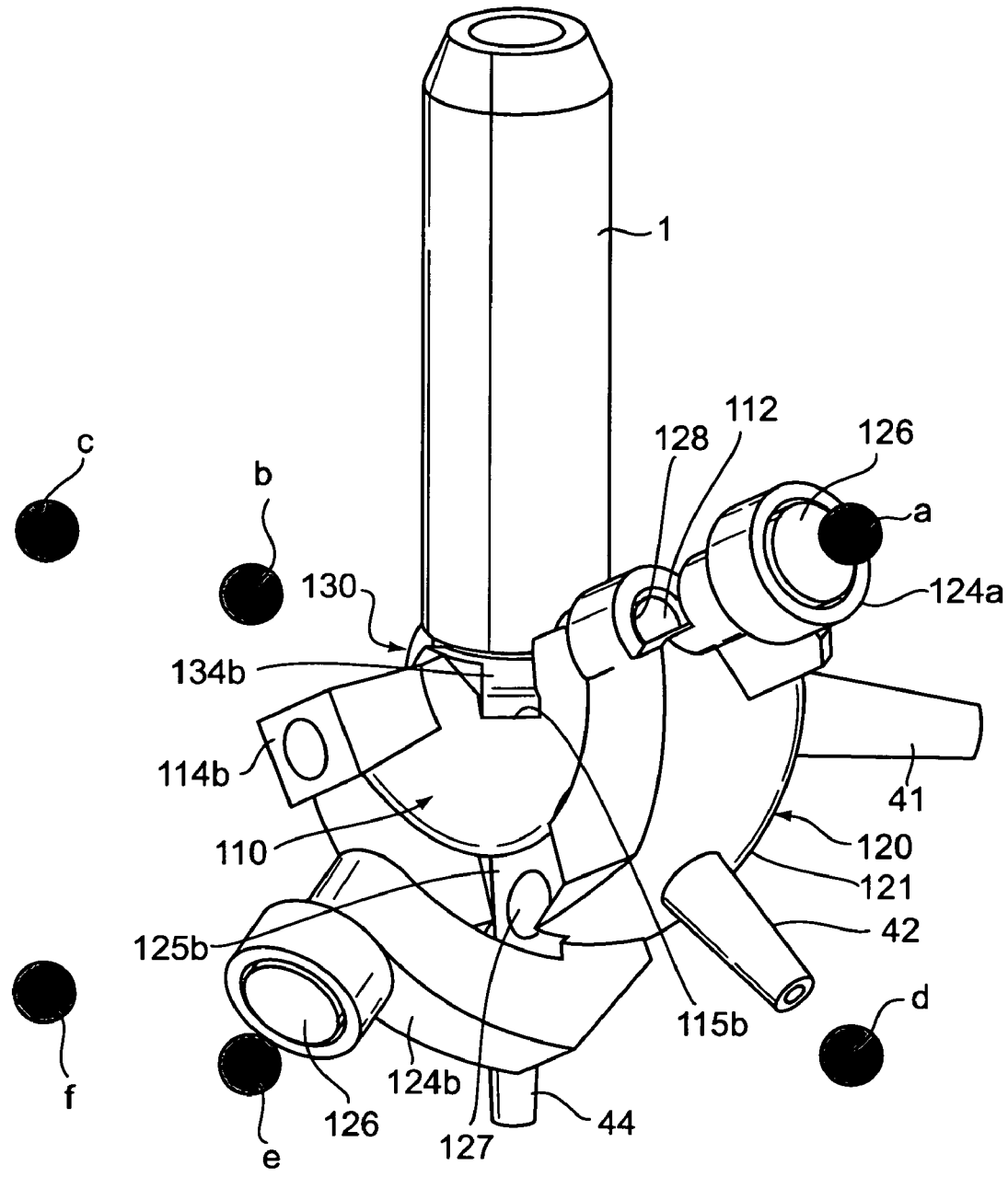
FIG. 4 is a perspective view of the nozzle unit shown in FIG. 1, and shows a state where a fourth nozzle is positioned in the vertical direction.

FIGS. 1 to 4 are perspective views of a nozzle unit according to an embodiment of the present invention. FIG. 1 is a diagram showing a state where a first nozzle 41 is positioned in a vertical direction. FIGS. 2 to 4 are diagrams respectively showing states where a second nozzle 42, a third nozzle 43, and a fourth nozzle 44 are positioned in the vertical direction. FIGS. 1 to 4 are all seen from the same direction.

As shown in FIG. 1, a nozzle unit 100 includes a rotating body 3 equipped with four nozzles (first to fourth nozzles described above) 41 to 44 that each hold a component using a negative pressure, and driving sources a to f schematically illustrated as a sphere. Examples of the component include various electronic components such as an IC package, a capacitor, a resistor, and a coil, but are not limited thereto.

The first to fourth nozzles 41 to 44 typically hold components of different sizes or types. Therefore, the first to fourth nozzles 41 to 44 have negative-pressure holding holes having different diameters. However, it is also possible for at least two of the first to fourth nozzles 41 to 44 to have the same hole diameter, that is, hold components of the same size, type, or the like.

Typically, the driving sources a to f are each a mechanism that generates a magnetic field by an electromagnetic induction and drives the rotating body 3 without being in contact therewith. Each of the driving sources a to f is constituted of, for example, a core and a coil (not shown).

The rotating body 3 includes a first shell member 110 and a second shell member 120 provided on an outer side of the first shell member 110 so as to cover the first shell member 110. The nozzle unit 100 includes a spindle component 1 that includes a passage (supplying channel) of air for generating a negative pressure and a zero pressure (or negative pressure and positive pressure) and constitutes a part of a spindle for vertically moving the nozzle unit 100, and a third shell member 130 attached at a lower portion of the spindle component 1 and provided so as to be covered by the first shell member 110. A zero pressure means that a pressure difference between internal and external pressures of the first to fourth nozzles 41 to 44 is 0.

Figure 5:
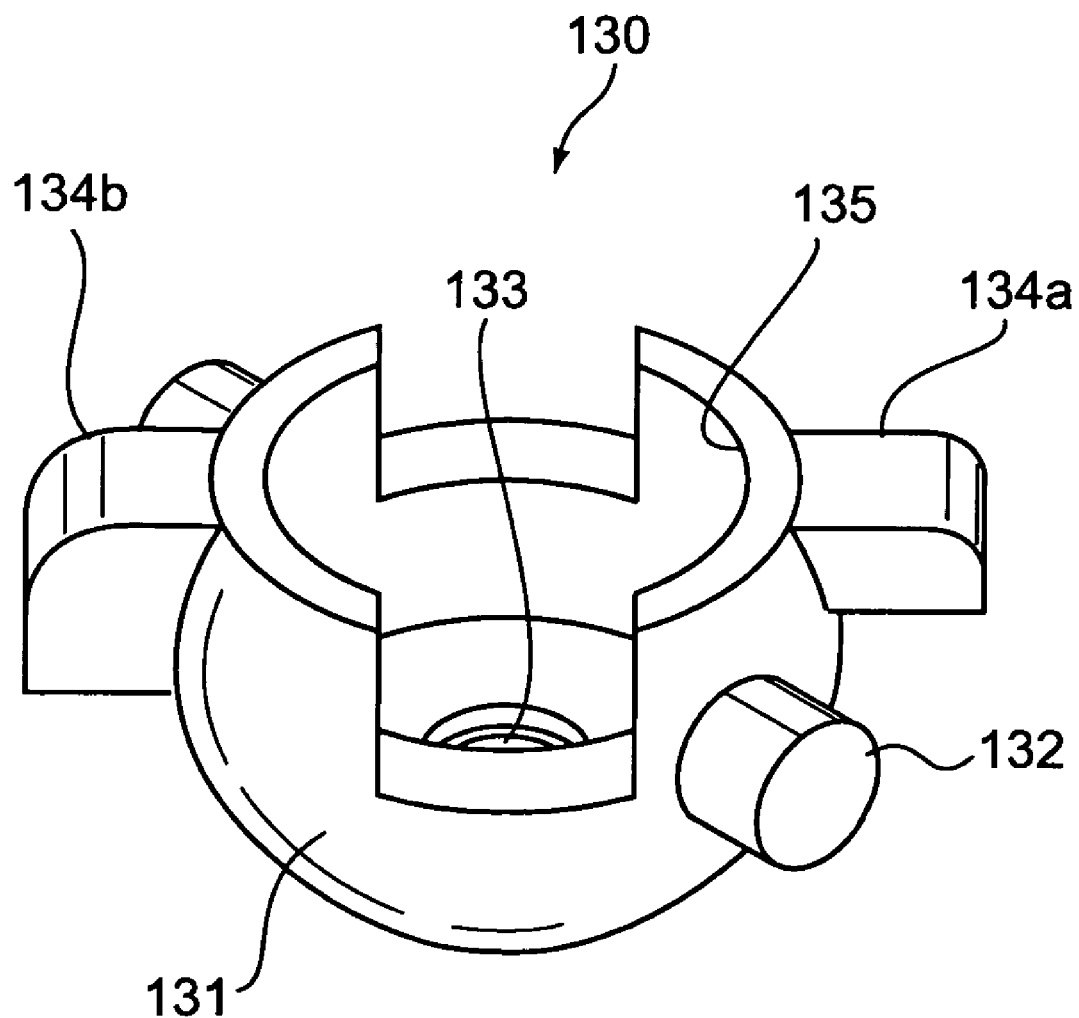
FIG. 5 is a perspective view of a third shell member.
Figure 6A:
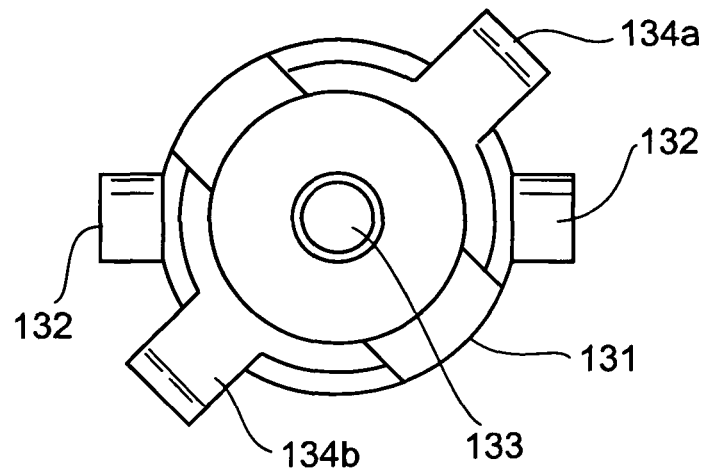
FIGS. 6A to 6C are diagrams showing the third shell member, FIG. 6A being a plan view thereof, FIG. 6B being a bottom view thereof, FIG. 6C being a side view thereof.
Figure 6B:
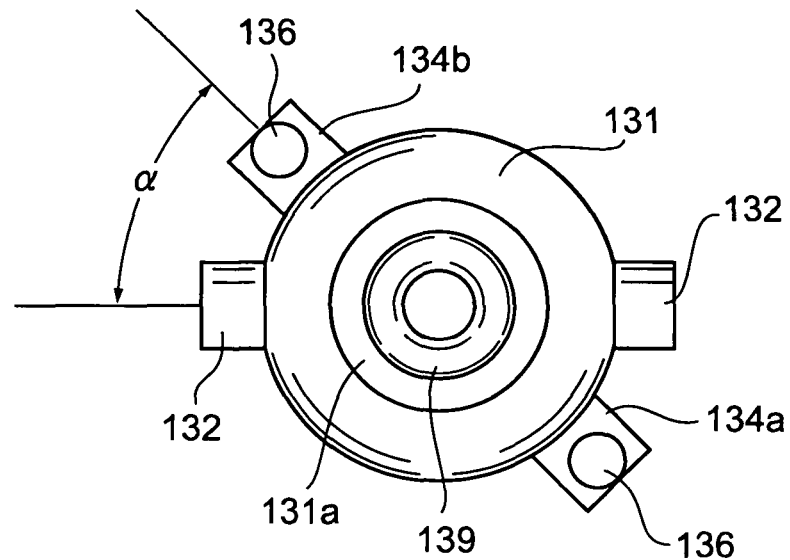
Figure 6C:
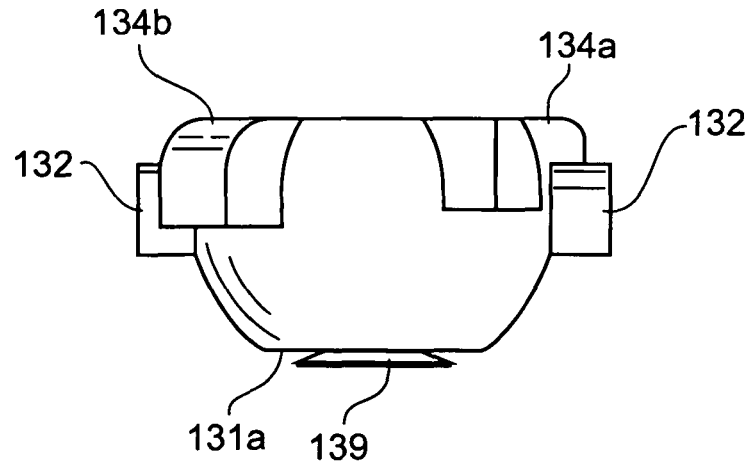
Figure 7:
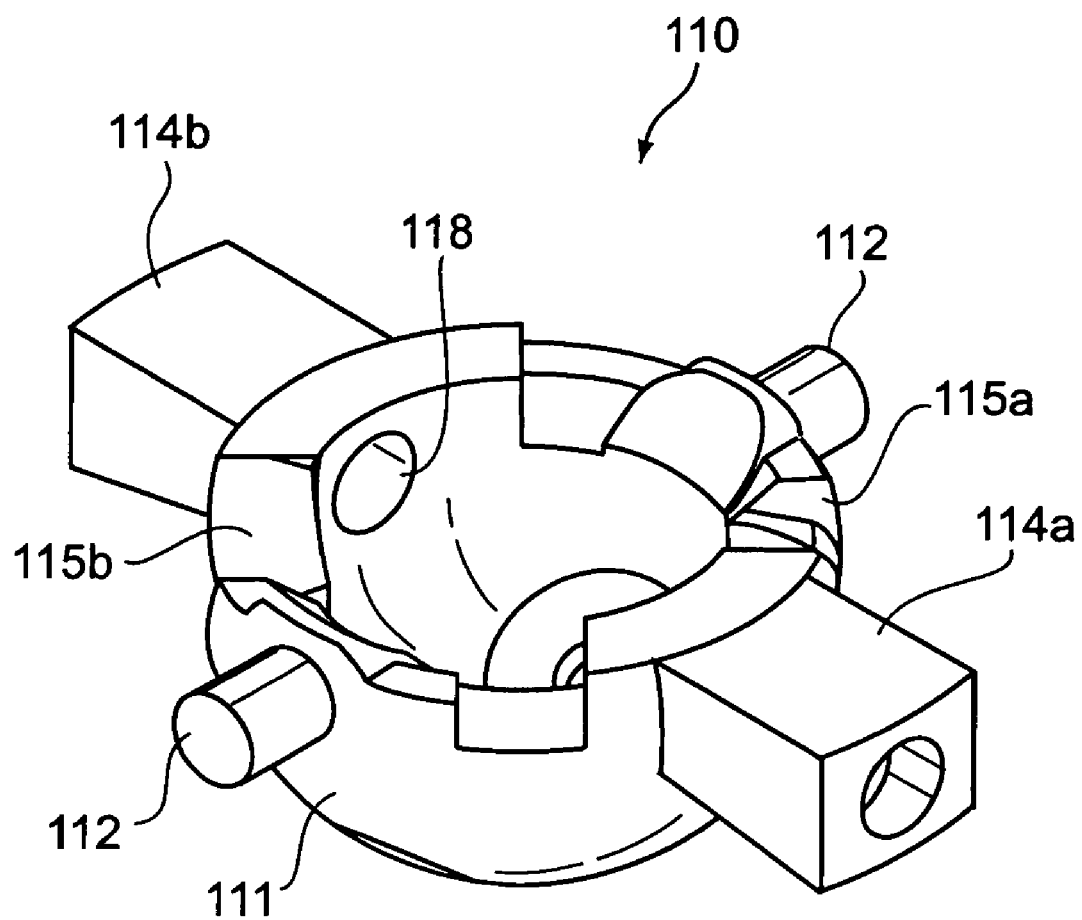
FIG. 7 is a perspective view of a first shell member.

FIG. 5 is a perspective view of the third shell member 130. FIGS. 6A to 6C are diagrams showing the third shell member 130, FIG. 6A being a plan view thereof, FIG. 6B being a bottom view thereof, FIG. 6C being a side view thereof. FIG. 7 is a perspective view of the first shell member 110. FIGS. 8A to 8D are diagrams showing the first shell member 110, FIG. 8A being a plan view thereof, FIG. 8B being a bottom view thereof, FIG. 8C being a side view thereof seen from a rotary-shaft portion side, FIG. 8D being a side view thereof seen from an engaging protrusion side. FIG. 9 is a perspective view of the second shell member 120. FIGS. 10A to 10D are diagrams showing the second shell member 120, FIG. 10A being a plan view thereof, FIG. 10B being a bottom view thereof, FIG. 10C being a side view thereof seen from a rotary-shaft portion side, FIG. 10D being a side view thereof seen from an engaging groove side.

Although the first shell member 110, the second shell member 120, and the third shell member 130 respectively include main bodies 111, 121, and 131 that each constitute a partial sphere, the main bodies 111, 121, and 131 have different shapes.

As shown in FIG. 5, the third shell member 130 includes a rotary-shaft portion 132 on a side surface of the main body 131, for example. The rotary-shaft portion 132 is fitted in a bearing portion 118 (see FIG. 7 or the like) provided to the main body 111 of the first shell member 110. With this structure, the first shell member 110 is rotatable only by a predetermined angle about the rotary-shaft portion 132.

For realizing the rotation by the predetermined angle, at least one of the third shell member 130 and the first shell member 110 includes a stopper for restricting a relative movement thereof, for example. As shown in FIG. 6B, the third shell member 130 typically includes, on a side surface of the main body 131, engaging protrusions 134a and 134b protruding from the main body 131 at positions practically α=45° away from the rotary-shaft portion 132, for example. The engaging protrusions 134a and 134b are respectively brought into contact with two engaging grooves 115a and 115b that have been formed as a notch at an upper portion of the main body 111 of the first shell member 110 shown in FIG. 7 to thus respectively engage therewith. Accordingly, a movement of the first shell member 110 is restricted at a predetermined position when the first shell member 110 rotates about the rotary-shaft portion 132 with respect to the third shell member 130, and the first shell member 110 thus rotates only by the predetermined angle.

As shown in FIG. 7, the first shell member 110 includes, for example, a rotary-shaft portion 112 on a side surface of the main body 111. The rotary-shaft portion 112 is fitted in a bearing portion 128 provided to the main body 121 of the second shell member 120 so that the second shell member 120 rotates about the rotary-shaft portion 112 only by a predetermined angle. For example, as shown in FIG. 8B, on the side surface of the main body 111 of the first shell member 110, two engaging protrusions 114a and 114b protrude from the main body 111 at positions practically α=90° away from the rotary-shaft portion 112. The engaging protrusions 114a and 114b are respectively brought into contact with two engaging grooves 125a and 125b that have been formed on the main body 121 of the second shell member 120 shown in FIG. 10A. Accordingly, a movement of the second shell member 120 is restricted at a predetermined position when the second shell member 120 rotates about the rotary-shaft portion 112 with respect to the first shell member 110, and the second shell member 120 thus rotates only by the predetermined angle.

Figure 8A:
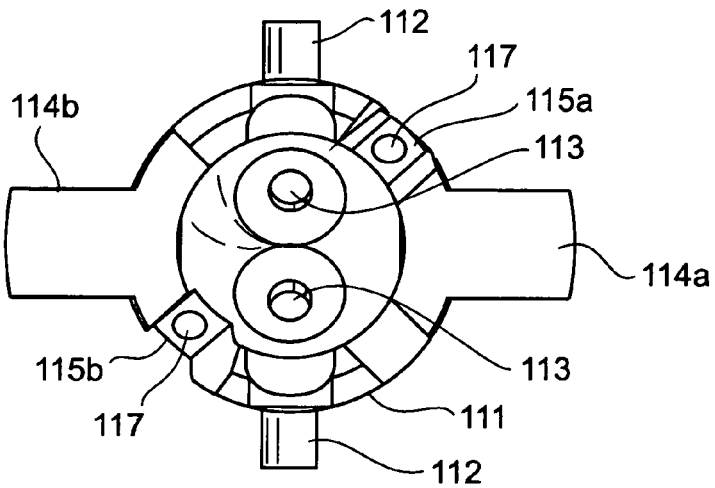
FIGS. 8A to 8D are diagrams showing the first shell member, FIG. 8A being a plan view thereof, FIG. 8B being a bottom view thereof, FIG. 8C being a side view thereof seen from a rotary-shaft portion side, FIG. 8D being a side view thereof seen from an engaging protrusion side.
Figure 8B:
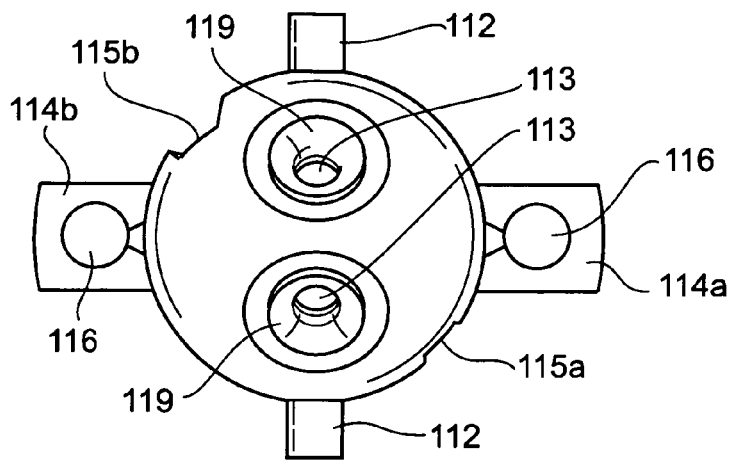
Figure 8C:
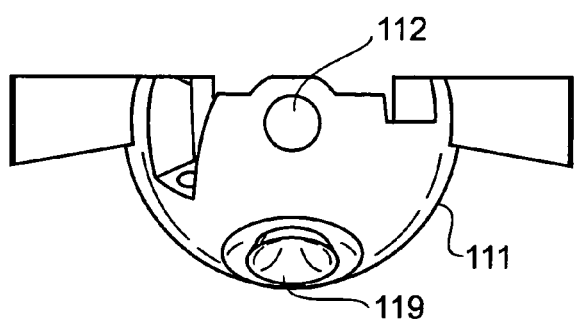
Figure 8D:
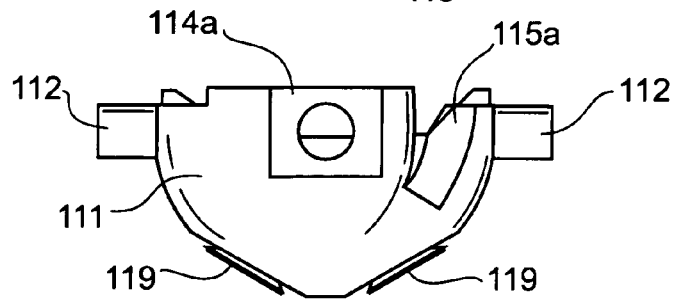
Figure 9:
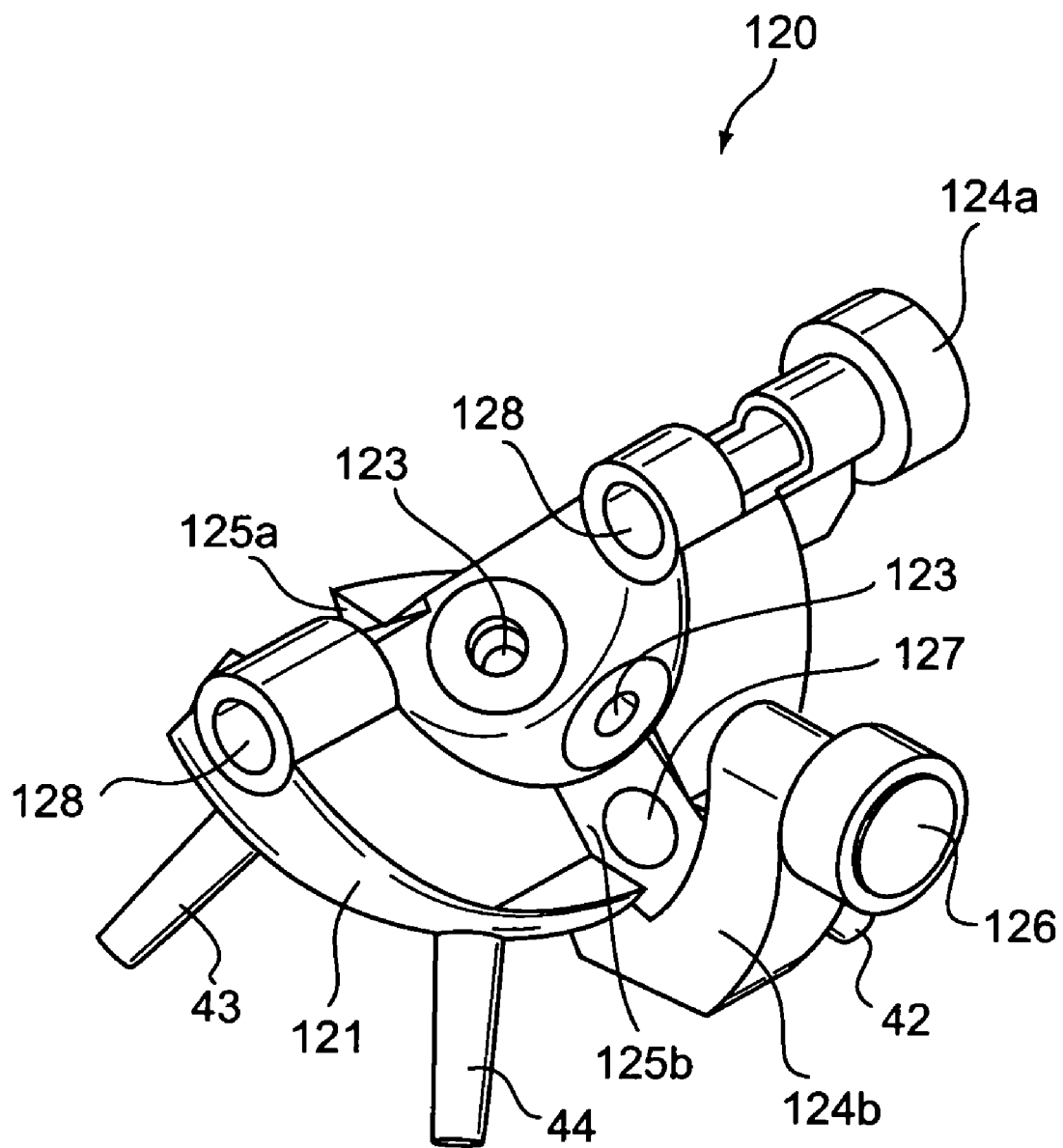
FIG. 9 is a perspective view of a second shell member.

Moreover, the engaging protrusions 114a and 114b of the first shell member 110 are provided at the same angular position (angular position within horizontal plane) as the bearing portion 118 in the plan view of FIG. 8A and the like. In other words, parts constituting a circumference of the bearing portion 118 provided to the first shell member 110 (engaging protrusions 114a and 114b) are used as protrusions that engage with the engaging grooves 125a and 125b of the second shell member 120. Accordingly, a size reduction of the rotating body 3 and the nozzle unit 100 can be realized.

An angle between an axial direction of the rotary-shaft portion 132 and an axial direction of the rotary-shaft portion 112 is substantially 90°. Accordingly, a rotational direction of the first shell member 110 and a rotational direction of the second shell member 120 differ 90°.

Structures of the rotary-shaft portion 132 provided to the third shell member 130 and the bearing portion 118 provided to the first shell member 110 may be inversed. In other words, a bearing portion may be provided to the third shell member 130 and a rotary-shaft portion provided to the first shell member 110 may be connected to the bearing portion of the third shell member 130.

Structures of the rotary-shaft portion 112 provided to the first shell member 110 and the bearing portion 128 provided to the second shell member 120 may be inversed. In other words, a bearing portion may be provided to the first shell member 110 and a rotary-shaft portion provided to the second shell member 120 may be connected to the bearing portion of the first shell member 110.

As shown in FIG. 6C, a bottom surface 131a of the main body 131 of the third shell member 130 is formed as a plane, and an opening 133 is formed at substantially the center of the bottom surface 131a. In addition, as shown in FIGS. 8A and 8B, at a bottom portion of the main body 111 of the first shell member 110, two openings 113 are formed next to each other so as to coincide with rotational directions of the first shell member 110. Moreover, as shown in FIG. 10A, at a bottom portion of the main body 121 of the second shell member 120, two pairs of openings 123 are formed next to each other so as to coincide with rotational directions of the second shell member 120 with respect to the third shell member 130, that is, two orthogonal rotational directions. The four openings 123 of the second shell member 120 are respectively connected with the first to fourth nozzles 41 to 44. Accordingly, the first to fourth nozzles 41 to 44 described above extend radially, for example.

A passage 1a provided inside the spindle component 1 and through which air passes is in communication with the inside of the main body 131 via an opening 135 provided at an upper portion of the main body 131 of the third shell member 130. Therefore, the passage 1a of the spindle component 1 is in communication with the inside of the first to fourth nozzles 41 to 44 via the inside of the main body 131 of the third shell member 130, the opening 133, the inside of the main body 111 of the first shell member 110, one of the openings 113, the inside of the main body 121 of the second shell member 120, and one of the openings 123. Thus, the negative pressure and the zero pressure (or negative pressure and positive pressure) from the spindle component 1 are delivered to the first to fourth nozzles 41 to 44.

Attached to the opening 133 of the third shell member 130 on the bottom surface 131a side is a lip seal 139. Also attached to the openings 113 of the first shell member 110 on a bottom portion side are lip seals 119. When one of the four nozzles 41 to 44 is selected and a negative pressure is generated in the nozzle unit 100, the lip seal 139 sticks to an inner surface of the main body 111 of the first shell member 110 so as to cover either one of the openings 113 of the first shell member 110. Similarly, when one of the four nozzles 41 to 44 is selected and a negative pressure is generated in the nozzle unit 100, one of the lip seals 119 of the first shell member 110 sticks to an inner surface of the main body 121 of the second shell member 120 so as to cover the opening 123 that corresponds to the selected nozzle out of the four openings 123 of the second shell member 120.

The lip seals 139 and 119 are formed of a material such as rubber and a resin, and airtightness inside the rotating body 3 can be enhanced due to an adsorption action thereof.

Prior to the generation of a negative pressure, a gap is provided between the lip seal 139 and the inner surface of the main body 111 of the first shell member 110. Similarly, prior to the generation of a negative pressure, a gap is also provided between the lip seal 119 and the inner surface of the main body 121 of the second shell member 120. Due to the negative pressure, the lip seals 139 and 119 extend and stick to the inner surfaces of the main bodies 111 and 121, respectively. Accordingly, even when there are gaps between the third shell member 130 and the first shell member 110 and between the first shell member 110 and the second shell member 120, airtightness can be enhanced while reducing energy for generating a negative pressure. Moreover, since a frictional resistance at a time of the rotation of the rotating body 3 is caused only at the bearing portion due to the gaps, driving energy can be reduced as much as possible.

It should be noted that the lip seals 139 and 119 may be in contact with the inner surfaces of the main bodies 111 and 121, respectively, even before the generation of a negative pressure. In this case, a driving force of the driving sources a to f only needs to top frictional forces between the lip seals 139 and 119 and the inner surfaces of the main bodies 111 and 121, respectively.

The lip seals may be attached on an inner surface side of the main body 111 of the first shell member 110 so that one of the lip seals sticks to the opening 133 from an outer side of the main body 131 of the third shell member 130. Similarly, the lip seals may be attached on an inner surface side of the main body 121 of the second shell member 120 so that one of the lip seals sticks to one of the openings 113 from an outer side of the main body 111 of the first shell member 110.

As shown in FIGS. 6B and 8A, at least one of the engaging protrusion 134a (and 134b) of the third shell member 130 and the engaging groove 115a (and 115b) of the first shell member 110 is provided with a sucking member 136 or 117 that causes a suction force to act between the engaging protrusion 134a (and 134b) and the engaging groove 115a (and 115b).

The sucking members 136 and 117 may both be a permanent magnet, or either one of them may be a permanent magnet while the other is an unmagnetized magnetic body. Alternatively, without being limited thereto, it is also possible that a permanent magnet is provided to the engaging protrusions (or engaging grooves) and the first shell member 110 (or third shell member 130) is constituted of the unmagnetized magnetic body. Due to the sucking members 136 and 117, the first shell member 110 can be positioned by an appropriate force without variances. The force can be adjusted highly accurately based on a magnetic intensity of the permanent magnet, a size of the magnetic bodies, distances between the sucking members 136 and 117 at the positioning position, and the like.

As shown in FIGS. 9 and 10A to 10C, the second shell member 120 includes levers 124a and 124b that extend in mutually-orthogonal directions. A magnetic body 126 is attached to each of the levers 124a and 124b at end portions thereof. The magnetic bodies 126 may each be an unmagnetized magnetic body or a permanent magnet. In the case where the magnetic bodies 126 are permanent magnets, divisional directions of magnetic poles thereof only need to be directed toward a center side and outer side of the rotating body 3 as shown in FIG. 10A for the rotating body 3 to be driven by the driving sources a to f to be described later.

As described above, the second shell member 120 is provided with the levers 124a and 124b as driven portions driven by the driving sources a to f. Therefore, by driving the second shell member 120, the driving sources a to f can rotate the rotating body 3 without driving the first shell member 110.

FIGS. 11 to 14 are perspective views respectively corresponding to FIGS. 1 to 4, and show states where the spindle component 1 is removed to help understand movements of the first, second, and third shell members 110, 120, and 130. FIGS. 11 to 14 show states where a position of the rotating body 3 is controlled so that the first nozzle 41, the second nozzle 42, the third nozzle 43, and the fourth nozzle 44, respectively, are positioned in the vertical direction (so as to be selected). FIGS. 11 to 14 are all seen from the same direction.

As described above, the driving sources a to f typically generate magnetic fields by an electromagnetic induction.

Figure 11:
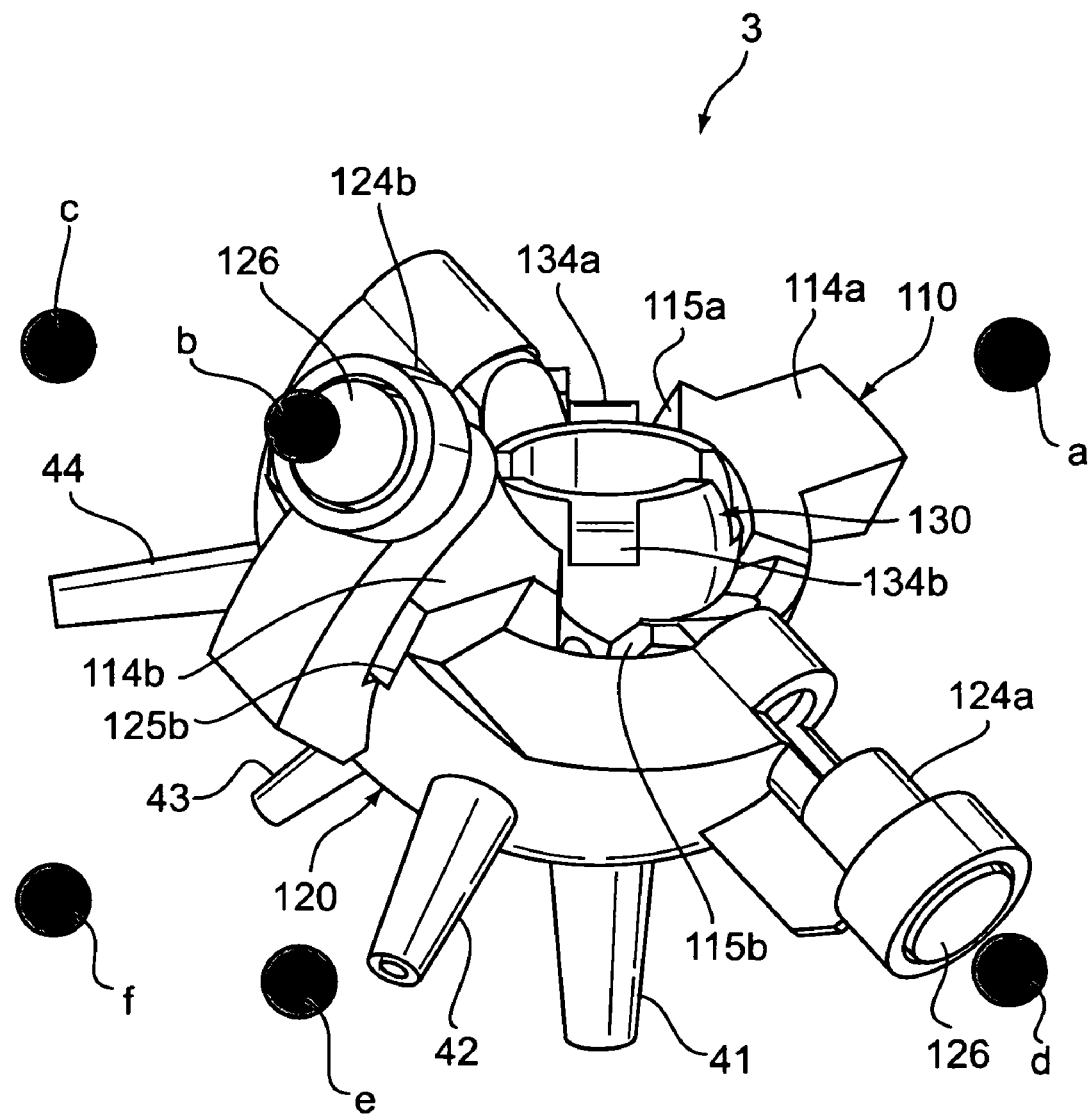
FIG. 11 is a perspective view corresponding to FIG. 1 and shows a state where a spindle component is removed to help understand movements of the first to third shell members.

As shown in FIG. 11, by the driving sources b and d causing the magnetic fields to act on the rotating body 3, the rotating body 3 moves so that the levers are brought close to the driving sources b and d and the first nozzle 41 is thus selected. In this case, the engaging protrusion 134a of the third shell member 130 and the engaging groove 115a of the first shell member 110 engage with each other and the engaging protrusion 114b of the first shell member 110 and the engaging groove 125b of the second shell member 120 engage with each other so that the movement of the rotating body 3 is restricted.

Figure 12:
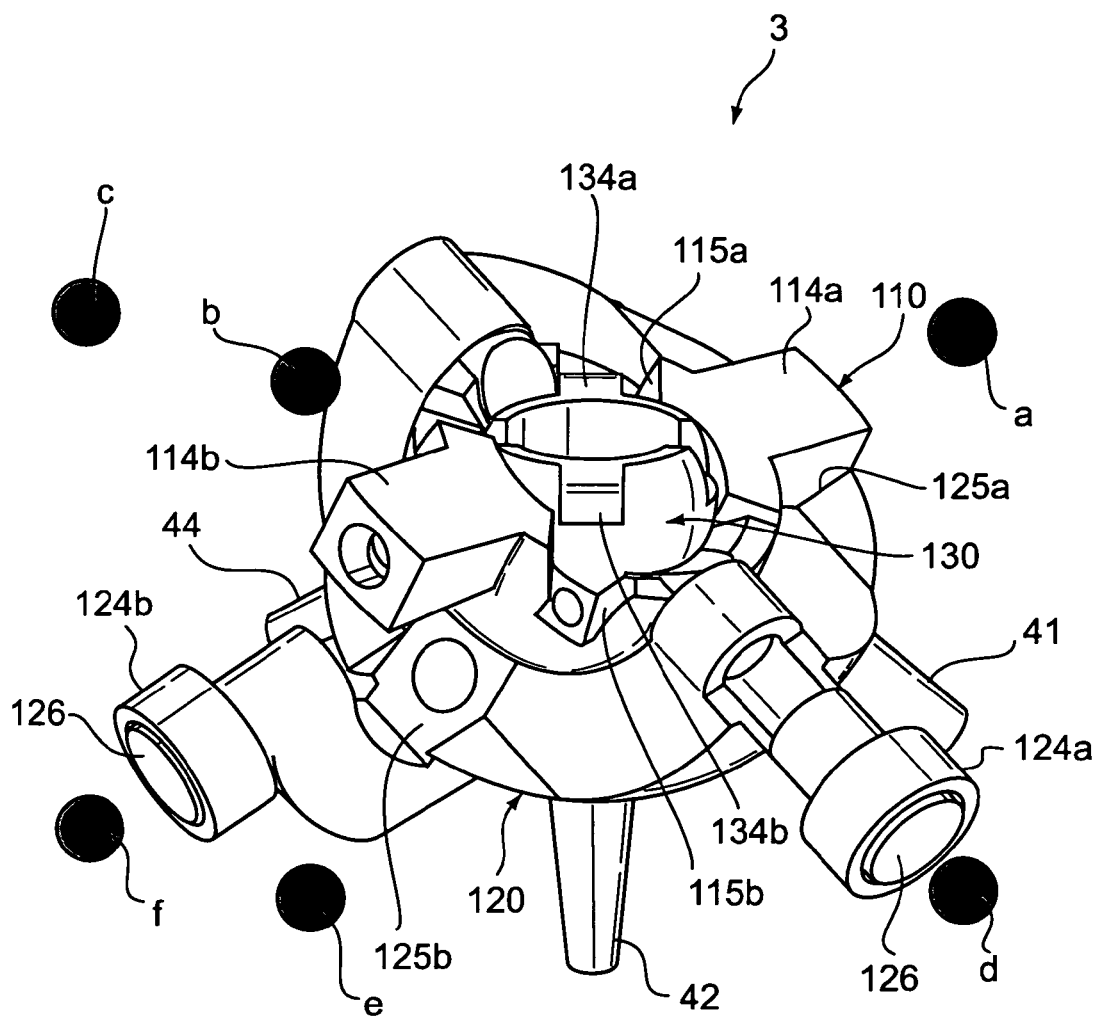
FIG. 12 is a perspective view corresponding to FIG. 2 and shows a state where the spindle component is removed to help understand the movements of the first to third shell members.

As shown in FIG. 12, by the driving sources d and f causing the magnetic fields to act on the rotating body 3, the rotating body 3 moves so that the levers are brought close to the driving sources d and f and the second nozzle 42 is thus selected. In this case, the engaging protrusion 134a of the third shell member 130 and the engaging groove 115a of the first shell member 110 engage with each other and the engaging protrusion 114a of the first shell member 110 and the engaging groove 125a of the second shell member 120 engage with each other so that the movement of the rotating body 3 is restricted.

Figure 13:
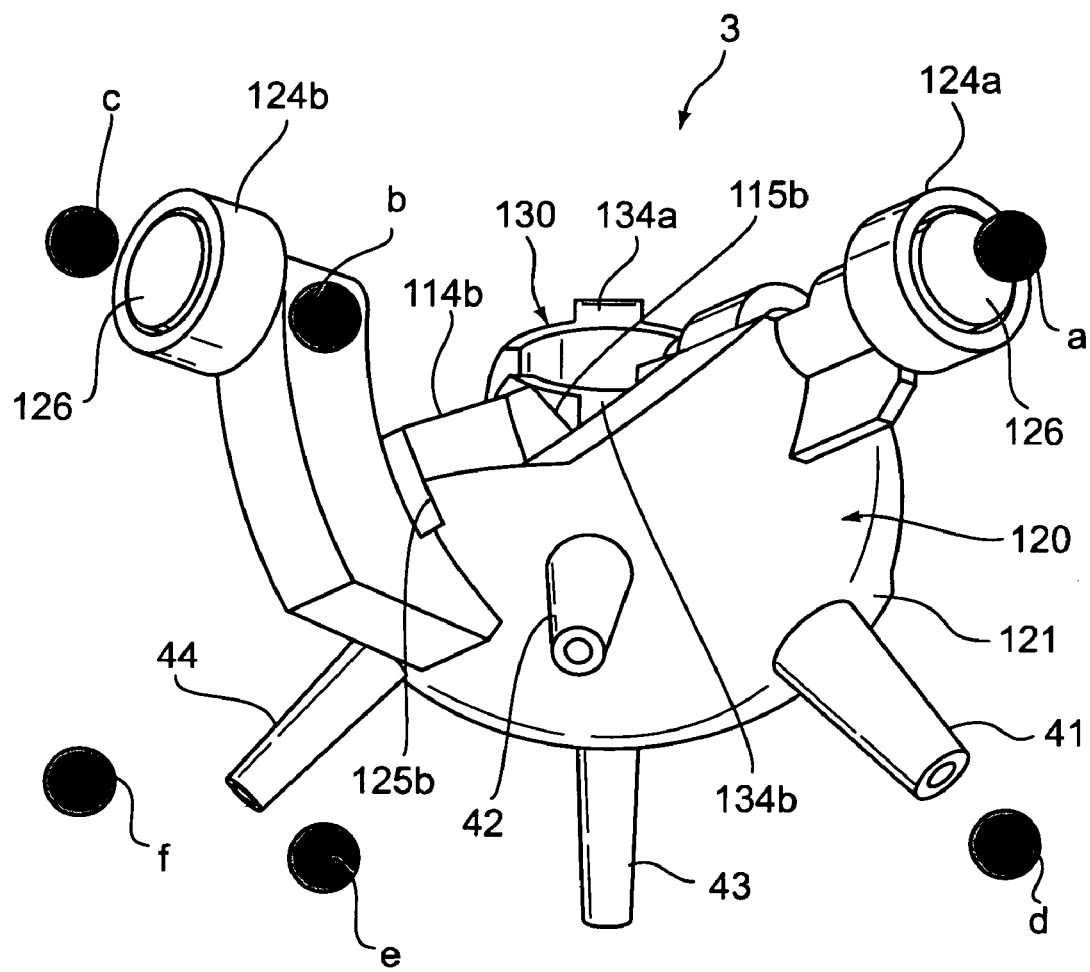
FIG. 13 is a perspective view corresponding to FIG. 3 and shows a state where the spindle component is removed to help understand the movements of the first to third shell members.

As shown in FIG. 13, by the driving sources a and c causing the magnetic fields to act on the rotating body 3, the rotating body 3 moves so that the levers are brought close to the driving sources a and c and the third nozzle 43 is thus selected. In this case, the engaging protrusion 134b of the third shell member 130 and the engaging groove 115b of the first shell member 110 engage with each other and the engaging protrusion 114b of the first shell member 110 and the engaging groove 125b of the second shell member 120 engage with each other so that the movement of the rotating body 3 is restricted.

Figure 14:
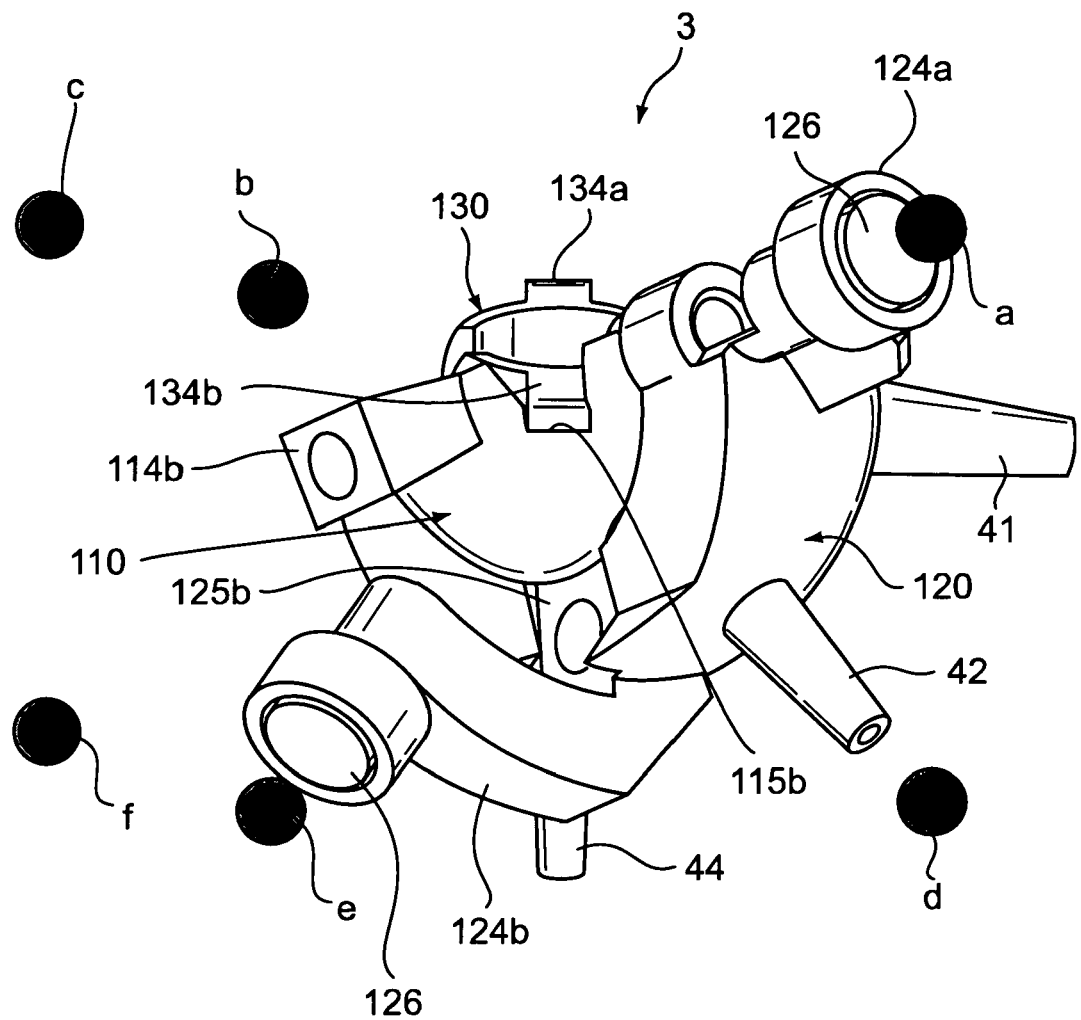
FIG. 14 is a perspective view corresponding to FIG. 4 and shows a state where the spindle component is removed to help understand the movements of the first to third shell members.
Figure 15:
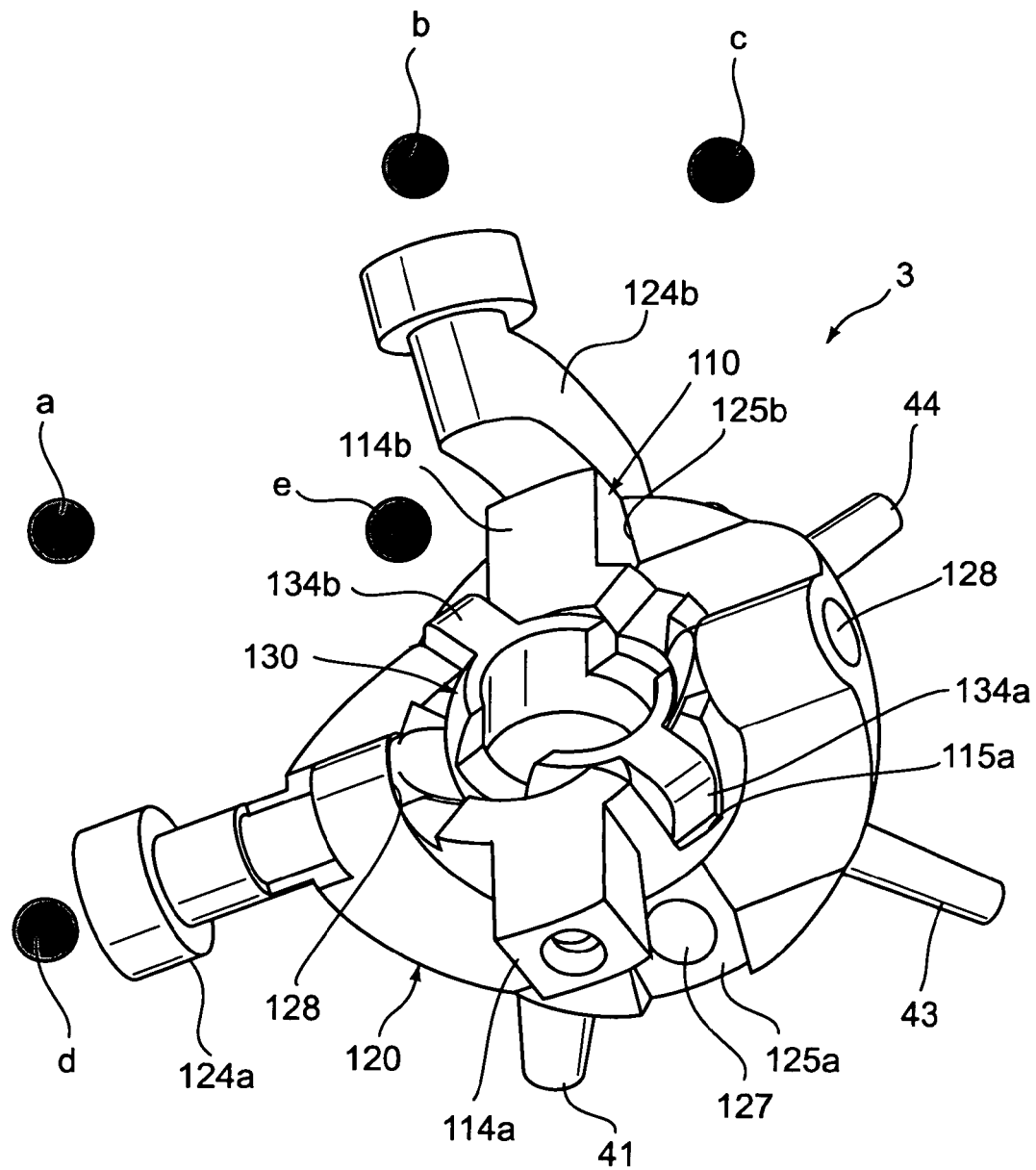
FIG. 15 is a diagram corresponding to FIG. 11, which is obtained as a result of changing a direction in which the nozzle unit is viewed by rotating it 135° within a horizontal plane and viewing the nozzle unit from a slightly higher position than in FIG. 11.
Figure 16:
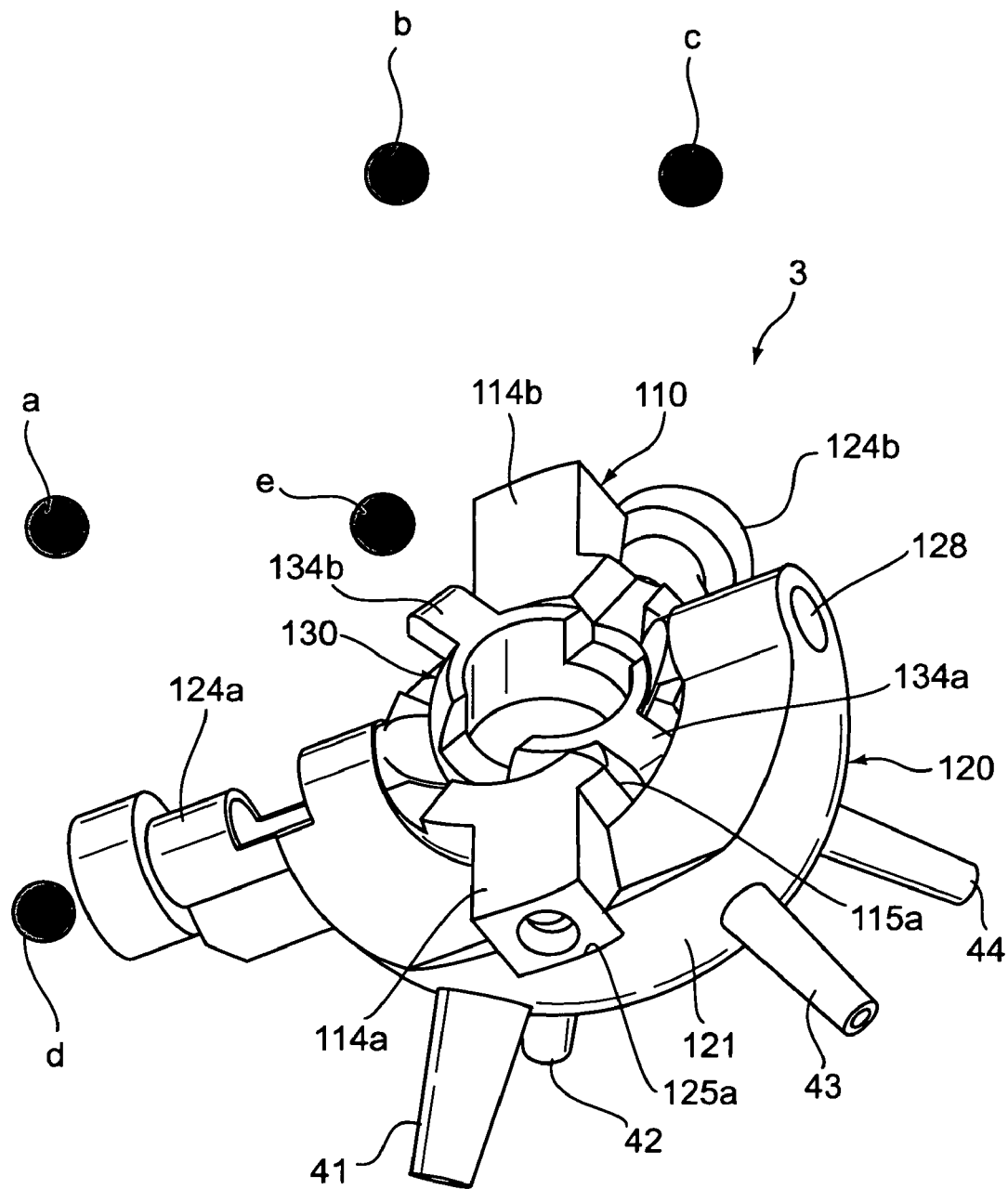
FIG. 16 is a diagram corresponding to FIG. 12, which is obtained as a result of changing a direction in which the nozzle unit is viewed by rotating it 135° within the horizontal plane and viewing the nozzle unit from a slightly higher position than in FIG. 12.
Figure 17:
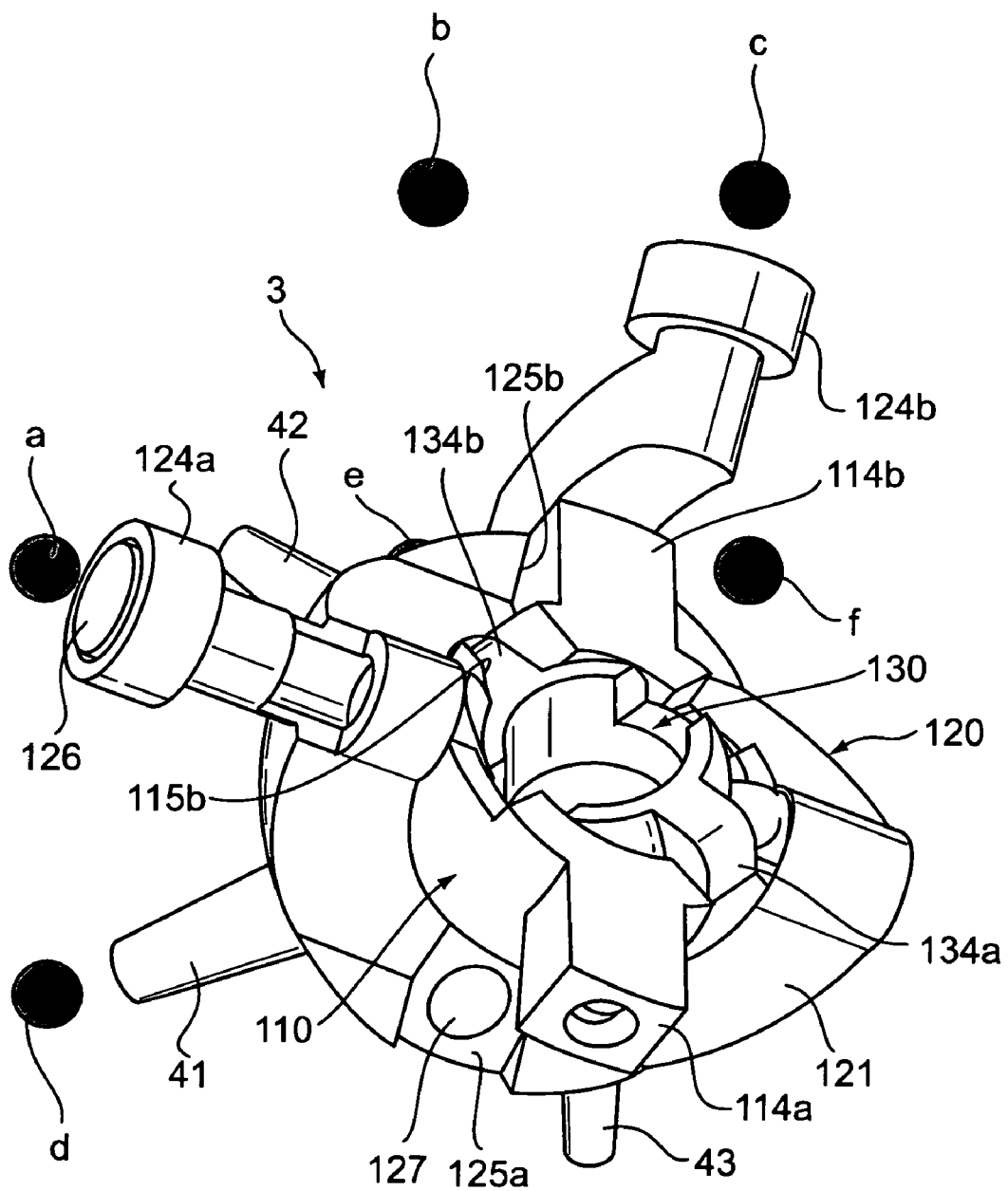
FIG. 17 is a diagram corresponding to FIG. 13, which is obtained as a result of changing a direction in which the nozzle unit is viewed by rotating it 135° within the horizontal plane and viewing the nozzle unit from a slightly higher position than in FIG. 13.
Figure 18:
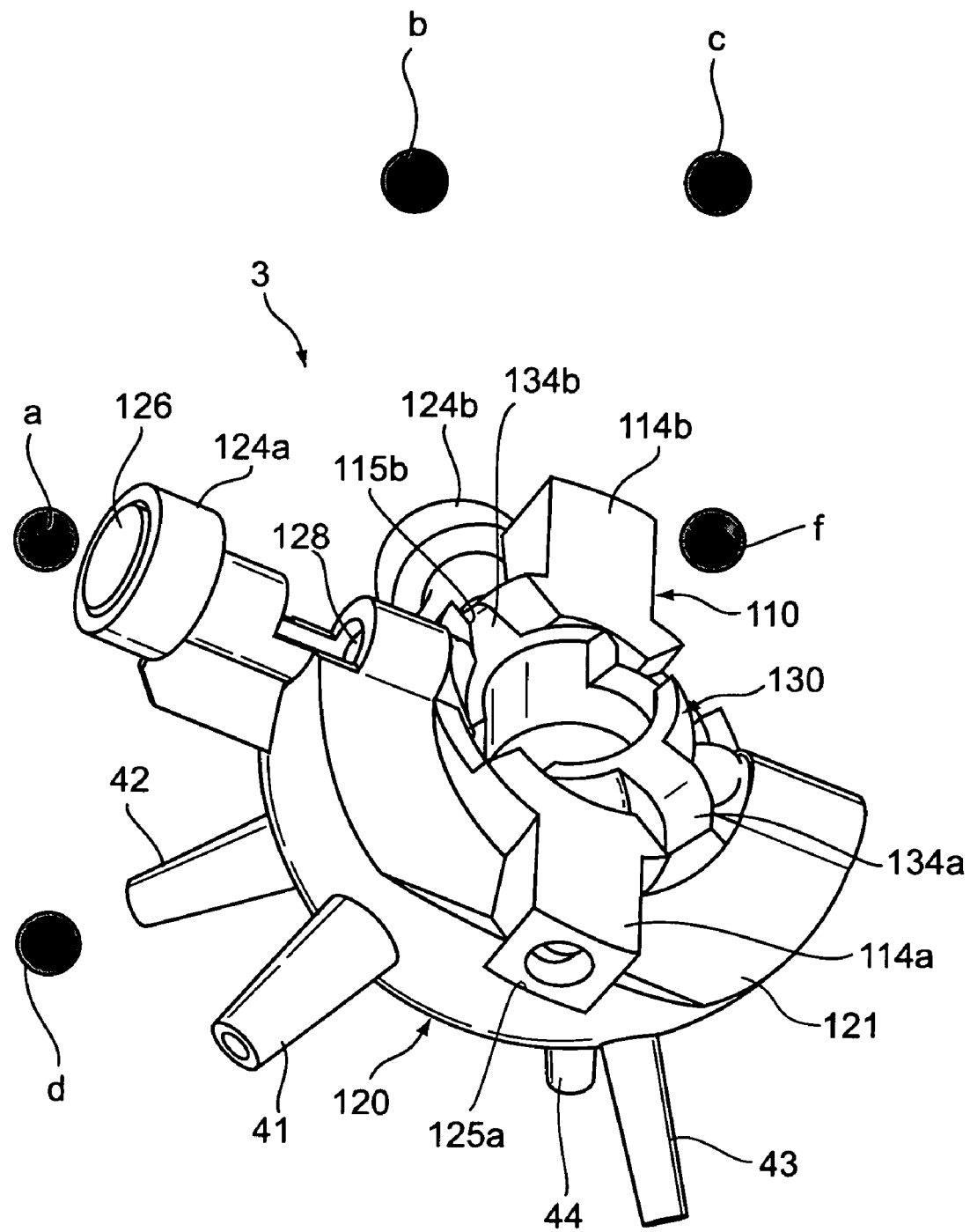
FIG. 18 is a diagram corresponding to FIG. 14, which is obtained as a result of changing a direction in which the nozzle unit is viewed by rotating it 135° within the horizontal plane and viewing the nozzle unit from a slightly higher position than in FIG. 14.

As shown in FIG. 14, by the driving sources a and e causing the magnetic fields to act on the rotating body 3, the rotating body 3 moves so that the levers are brought close to the driving sources a and e and the fourth nozzle 44 is thus selected. In this case, the engaging protrusion 134b of the third shell member 130 and the engaging groove 115b of the first shell member 110 engage with each other and the engaging protrusion 114a of the first shell member 110 and the engaging groove 125a of the second shell member 120 engage with each other (see FIG. 18) so that the movement of the rotating body 3 is restricted.

FIGS. 15 to 18 are diagrams obtained as a result of changing a direction in which the nozzle unit 100 shown in corresponding one of FIGS. 11 to 14 is viewed by rotating it 135° within the horizontal plane and viewing the nozzle unit 100 from a slightly higher position than in corresponding one of FIGS. 11 to 14.

As described above, by the drive of the driving sources a to f, one of the two openings 113 provided to the main body 111 of the first shell member 110 selectively faces one of the four openings 123 provided to the main body 121 of the second shell member 120, with the result that the first to fourth nozzles 41 to 44 to be used are switched selectively.

As described above, because the driving sources a to f drive the rotating body 3 without being in contact therewith in this embodiment, a mechanically complex mechanism is unnecessary and production of dust can be suppressed. Moreover, due to the non-contact driving method, a power source does not need to be provided to the rotating body 3, and electrical wiring or the like with respect to the rotating body 3 thus becomes unnecessary. In addition, since a power source does not need to be provided to the rotating body 3, the nozzle unit 100 becomes light, and a size reduction of the nozzle unit 100 can be realized.

Because the rotating body 3 rotates three-dimensionally in this embodiment, the plurality of nozzles 41 to 44 provided radially in 3D can be used effectively, for example. In particular, in the rotating body 3, the first shell member 110 and the second shell member 120 rotate biaxially using axes that are practically orthogonal to each other. Therefore, as compared to a case where a member including the plurality of nozzles 41 to 44 is rotated using a spherical bearing, for example, positioning accuracy in positioning the nozzles by rotating the rotating body 3 by the driving sources a to f improves. Moreover, since a frictional force that acts on the first shell member 110 and the second shell member 120 becomes smaller than that in the case where the spherical bearing is used, driving energy of the driving sources also becomes smaller.

Next, a component mounting apparatus equipped with the nozzle unit 100 according to this embodiment will be described.

Figure 19:
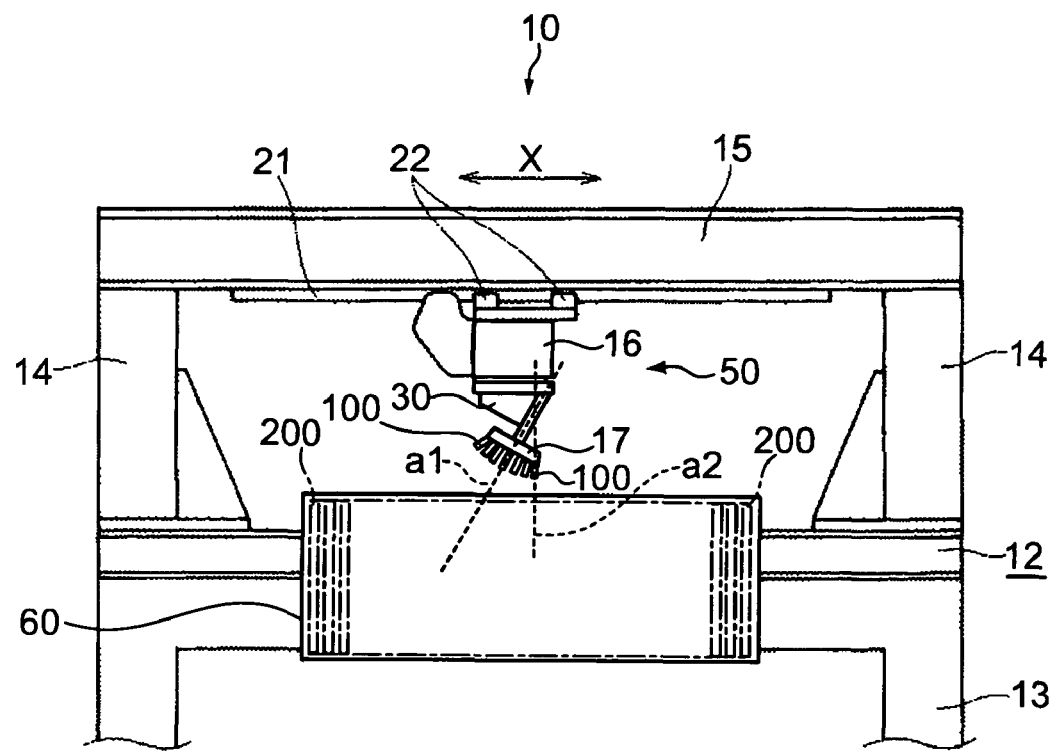
FIG. 19 is a front view of a component mounting apparatus according to an embodiment of the present invention.
Figure 20:
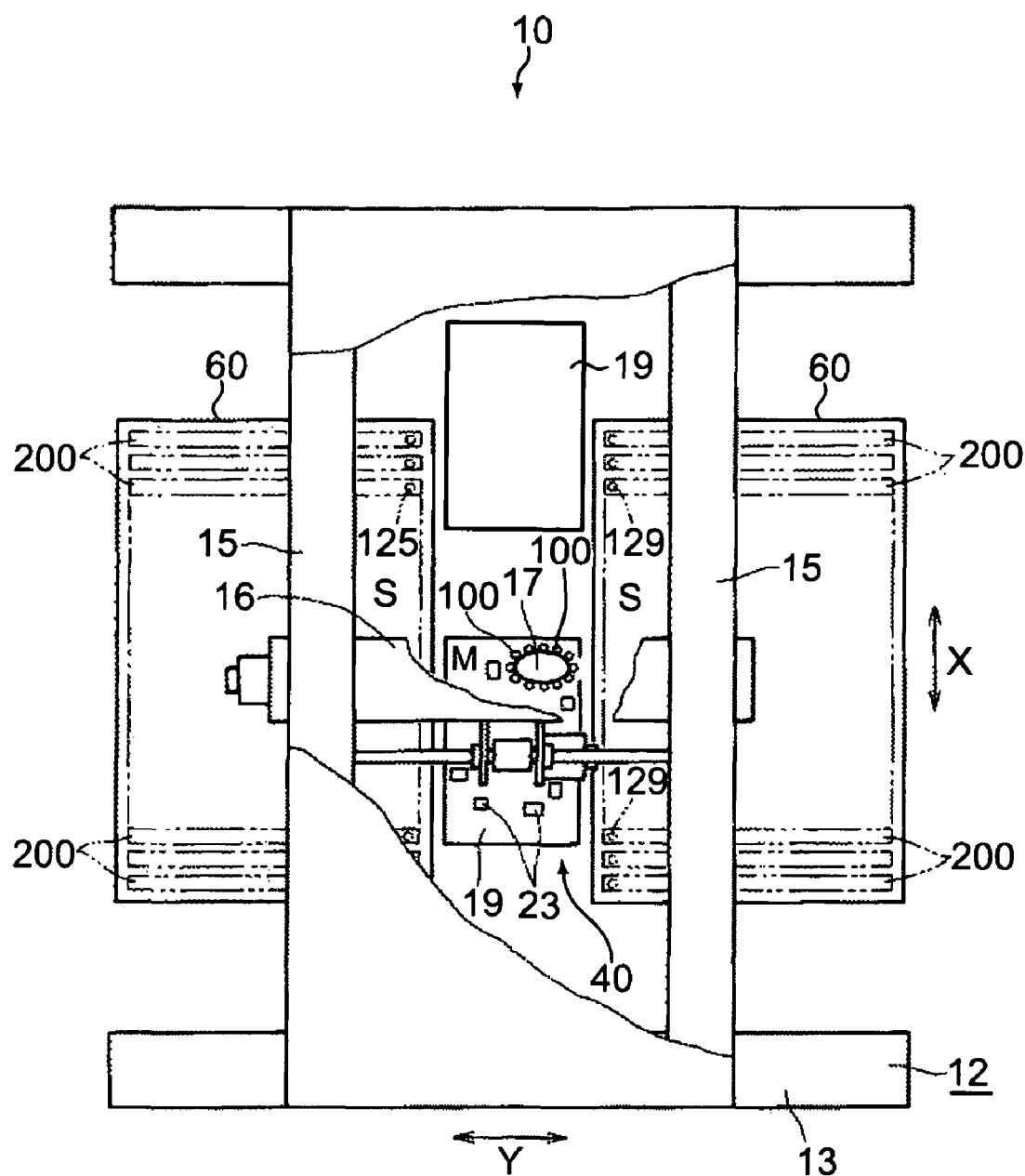
FIG. 20 is a plan view of a partially-fractured component mounting apparatus.
Figure 21:
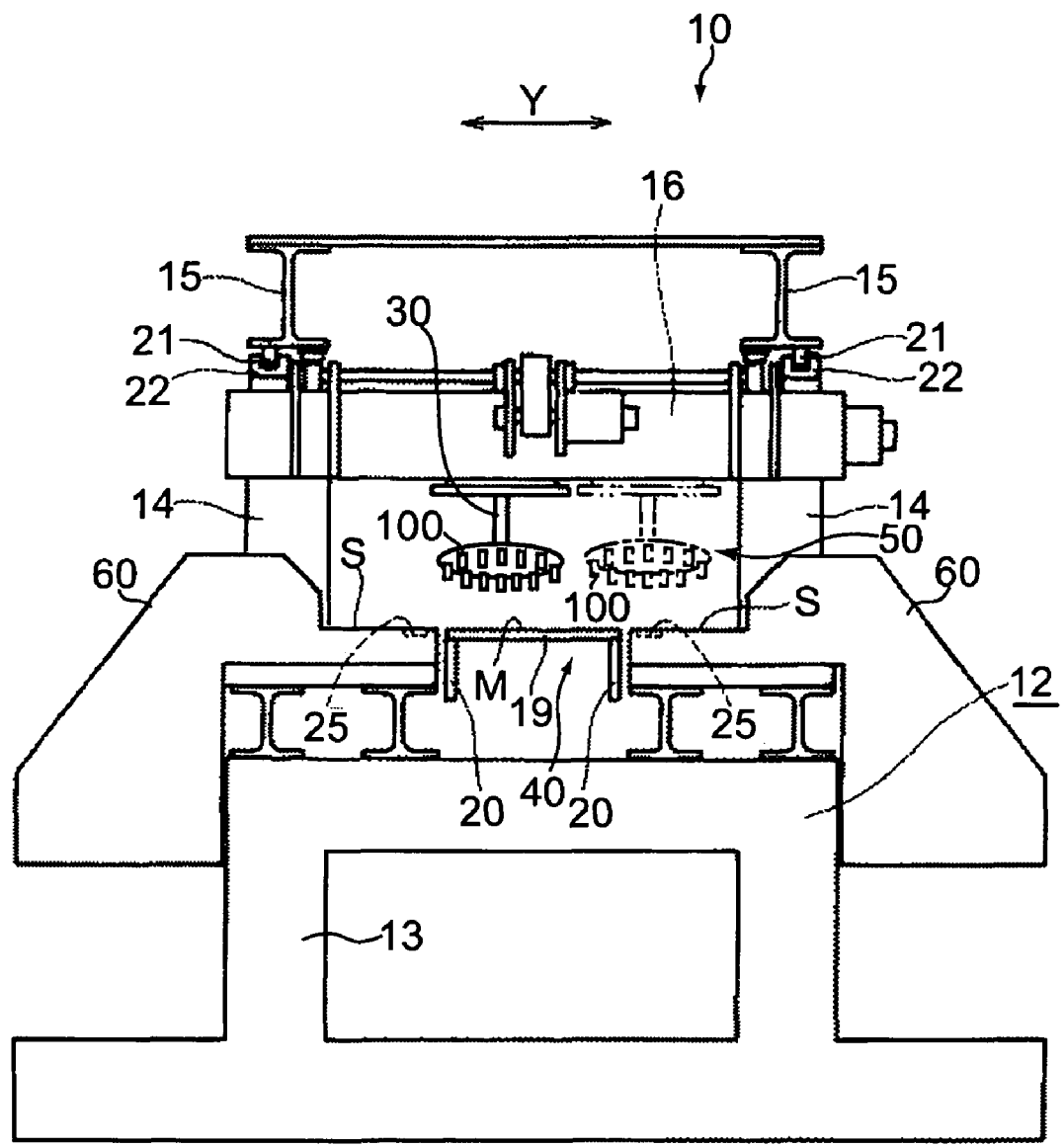
FIG. 21 is a side view of the component mounting apparatus.

FIG. 19 is a front view of a component mounting apparatus 10 according to an embodiment of the present invention. FIG. 20 is a plan view of a partially-fractured component mounting apparatus 10. FIG. 21 is a side view of the component mounting apparatus 10.

The component mounting apparatus 10 includes a substrate arranging portion 40 which is provided substantially at the center of the component mounting apparatus 10 and on which a circuit board 19 is placed, and tape-feeder arranging portions 60 disposed on both sides of the substrate arranging portion 40 and on which tape feeders 200 as component supplying apparatuses are disposed. Further, the component mounting apparatus 10 includes a mounting mechanism 50 that mounts electronic components 4 supplied from the tape feeders 200 on the circuit board 19 placed on the substrate arranging portion 40. The component supplying apparatus is not limited to the tape feeder, and other supplying apparatuses may also be used.

For example, the component mounting apparatus 10 includes a base portion 12, a pedestal 13 that supports the base portion 12, a plurality of supporting columns 14 erected on the pedestal 13, and a beam 15 bridged between, for example, two supporting columns 14. With four supporting columns 14, for example, two beams 15 are provided. In descriptions below, a direction in which the beam 15 extends may be referred to as X-axis direction, a direction orthogonal to an X axis within the horizontal plane may be referred to as Y-axis direction, and a vertical direction may be referred to as Z-axis direction.

The mounting mechanism 50 includes a plurality of nozzle units 100 described above for picking up the electronic components 4 from the tape feeders 200, a head 17 that supports the nozzle units 100, and a carriage 30 for moving the head 17. A movable body 16 extending in the Y-axis direction and movable in the X-axis direction is bridged between the beams 15. The carriage 30 is attached while being movable in the Y-axis direction along the movable body 16. Therefore, each of the nozzle units 100 mounted to the head 17 is movable within the horizontal plane (X-Y plane) using a moving mechanism including the carriage 30 and the movable body 16.

Typically, a guide rail 21 extending in the X-axis direction is provided on a lower surface of each of the beams 15. Guided bodies 22 fixed on an upper surface of the movable body 16 at both end portions are slidably engaged with the guide rails 21. Accordingly, the movable body 16 is movable in the X-axis direction along the beams 15. It should be noted that a ball screw driving mechanism, for example, is used as a driving system for moving the movable body 16. However, the present invention is not limited thereto, and a belt driving mechanism, a linear motor driving mechanism, or other driving mechanisms may be used instead.

As described above, the carriage 30 is movable in the Y-axis direction by a drive of a ball screw provided inside the movable body 16. Also in this case, a belt driving mechanism, a linear motor driving mechanism, or other driving mechanisms may be used instead of the ball screw.

The substrate arranging portion 40 is provided with a fixing mechanism 20 for fixing the circuit board 19 by supporting it from the bottom. The circuit board 19 is positioned by the fixing mechanism 20. In this embodiment, two circuit boards 19 are placed on the substrate arranging portion 40 with a predetermined gap therebetween. However, the number of circuit boards 19 to be placed is not limited thereto.

Figure 22:
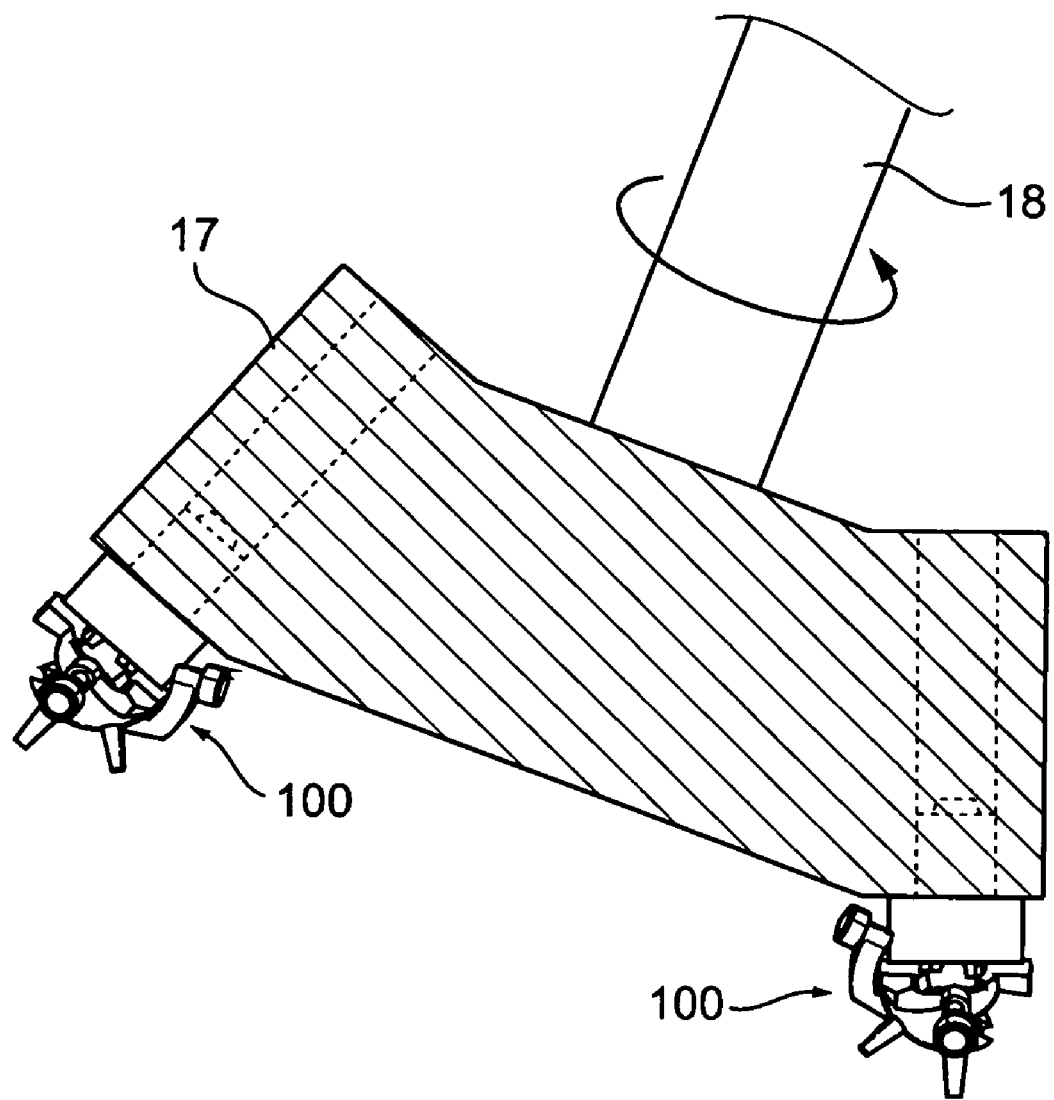
FIG. 22 is a diagram showing a part of a carriage, a head, and the nozzle units.

FIG. 22 is a diagram showing a part of the carriage 30, the head 17, and the nozzle units 100. As shown in the figure, the head 17 rotates by a motor (not shown) provided at an upper portion of the carriage 30 with a supporting shaft 18 that supports the head 17 as a main rotary shaft. An axial direction a1 of the supporting shaft 18 of the head 17 (see FIG. 19) is tilted with respect to the Z-axis direction.

The head 17 is provided with, for example, at an outer circumferential portion thereof, 12 nozzle units 100 disposed at regular intervals in a circumferential direction. A total of 48 nozzles are thus provided, for example. Each of the nozzle units 100 is mounted to the head 17 so that an axis line thereof (line of spindle component in longitudinal direction) is tilted with respect to a main rotary axis a1 of the head 17. The tilt is made such that an upper end of each of the nozzles of the nozzle unit 100 comes closer to the main rotary axis a1 of the head 17 than a lower end thereof. In other words, as a whole, the 12 nozzle units 100 are provided to the head 17 so as to be widened toward the end.

Each of the nozzle units 100 is supported by a spindle unit (not shown) including the spindle component while being movable with respect to the head 17 in the axial direction, and is lowered as the spindle unit is pressed downward by a pressing mechanism (not shown) when the nozzle unit 100 is positioned at an operating position to be described later. The pressing mechanism may be any mechanism such as a rack-and-pinion mechanism, a cam mechanism, a ball screw mechanism, a solenoid, and an air pressure generating mechanism.

The longitudinal direction of the spindle component of the nozzle unit 100 on a rear end side of the head 17, that is, at a far right end in FIG. 22 is oriented in the Z-axis direction, and a position on the rear end side corresponds to the operating position. The electronic component 4 is sucked or released by the nozzle unit 100 that is positioned in the vertical direction at the operating position.

Although not shown in FIGS. 19 to 22, the driving sources a to f of the nozzle unit 100 only need to be connected on the carriage 30 side.

The spindle component of the nozzle unit 100 described above is connected to an air compressor (not shown), and one of the nozzles selected by the driving sources a to f out of the nozzle unit 100 positioned at the operating position is switched between a positive pressure and a negative pressure at predetermined timings. Accordingly, a tip end portion of the selected nozzle sucks or releases the electronic component 4.

As described above, four nozzles are provided to each of the plurality of nozzle units 100 (one of which is referred to as first nozzle unit), and the four nozzles are of different sizes. The four nozzles of another nozzle unit 100 (second nozzle unit) are typically the same as those of the first nozzle unit. However, at least one set of the four nozzles of the first nozzle unit and the four nozzles of the second nozzle unit may be a nozzle of a different size or type. Alternatively, all of the 48 nozzles may be of different sizes or types.

An area occupied by the circuit board 19 positioned and fixed by the fixing mechanism 20 constitutes a component mounting area M.

As shown in FIG. 20, on the tape-feeder arranging portions 60 disposed on both the left- and right-hand sides of the component mounting area M, a plurality of tape feeders 200 are provided detachably. The plurality of tape feeders 200 are arranged in, for example, the X-axis direction. Though it is possible to mount 40 tape feeders 200 on each of the tape-feeder arranging portions 60, for example, the number of tape feeders 200 is not limited thereto. A carrier tape (not shown) of a single tape feeder 200 accommodates a large number of electronic components 4 of the same type. Each of the tape feeders 200 supplies those electronic components 4 to the selected one of the nozzles of the nozzle unit 100 as necessary.

The tape feeders 200 accommodate the electronic components 4 whose types are different for each of the tape feeders 200. The nozzle unit 100, one of the four nozzles of the nozzle unit 100, and the tape feeder 200 are selected in accordance with which electronic component 4 is to be mounted at what position on the circuit board 19 so that the selected nozzle sucks the electronic component 4.

It should be noted that although the tape-feeder arranging portions 60 are disposed on both the left- and right-hand sides of the component mounting area M in this embodiment, the tape-feeder arranging portions 60 may be provided on only one of the left- and right-hand sides of the component mounting area M.

A component supplying port 129 is provided at one end portion of each of the tape feeders 200. Each of the tape feeders 200 is mounted on the corresponding one of the tape-feeder arranging portions 60 such that the end portion to which the component supplying port 129 is provided faces the component mounting area M side. Each of the nozzles of the nozzle unit 100 picks up the electronic component 4 via the component supplying port 129. An area occupied by the nozzle unit 100 when picking up the electronic component 4 or an area occupied by the head 17 at that time (area including operating position) is set as a component supplying area S. The nozzle unit 100 of the head 17 at the operating position moves inside the component supplying area S, the component mounting area M, and an area connecting those areas S and M.

First, the head 17 moves to the component supplying area S and sequentially sucks given electronic components 4 using 12 nozzle units 100 provided to the head 17. Here, the number of nozzles to suck the electronic components 4 out of the 48 nozzles is arbitrary.

Upon the electronic components 4 being sucked by the nozzles, the head 17 moves to the component mounting area M and sequentially mounts the components sucked by the nozzles at predetermined positions on the circuit board 19 while adjusting movements in the X- and Y-axis directions. The head 17 is moved in the X- and Y-axis directions by the movable body 16 and the carriage 30 described above. By repeating this operation, the electronic components 4 are mounted on the circuit board 19.

By providing the plurality of nozzle units 100 to a single head as described above, a nozzle changer that has been provided to the component mounting apparatus in the related art becomes unnecessary, and a time loss due to an operation of detaching nozzles using the nozzle changer can thus be eliminated. Moreover, because a size reduction of the nozzle units 100 is required when the plurality of nozzle units 100 are provided to a single head, a merit of the driving sources a to f being a non-contact type increases.

Due to the provision of the lip seals in the nozzle unit 100 as described above, each of the nozzles can hold the electronic component 4 in a desired position even when a relatively-large negative pressure is generated. Specifically, in a case where a relatively-large negative pressure is generated in a nozzle, the lip seal sticks to the opening opposed thereto for the first time when one nozzle is selected. Therefore, it is possible to prevent the nozzle of the nozzle unit 100 from sucking the electronic component 4 and holding it in an inappropriate position before being lowered or while being lowered by the pressing mechanism.

Due to the use of the nozzle unit 100 as described above, 30%- to 40%-improvement in processing performance can be expected in a process that requires about four types of nozzles, for example.

Next, a nozzle unit according to another embodiment of the present invention that includes a rotating body that rotates two-dimensionally will be described. In descriptions below, descriptions on components, functions, and the like that are the same as those of the nozzle unit 100 according to the embodiment described with reference to FIGS. 1 to 18 will be simplified or omitted, and different points will mainly be described.

Figure 23:
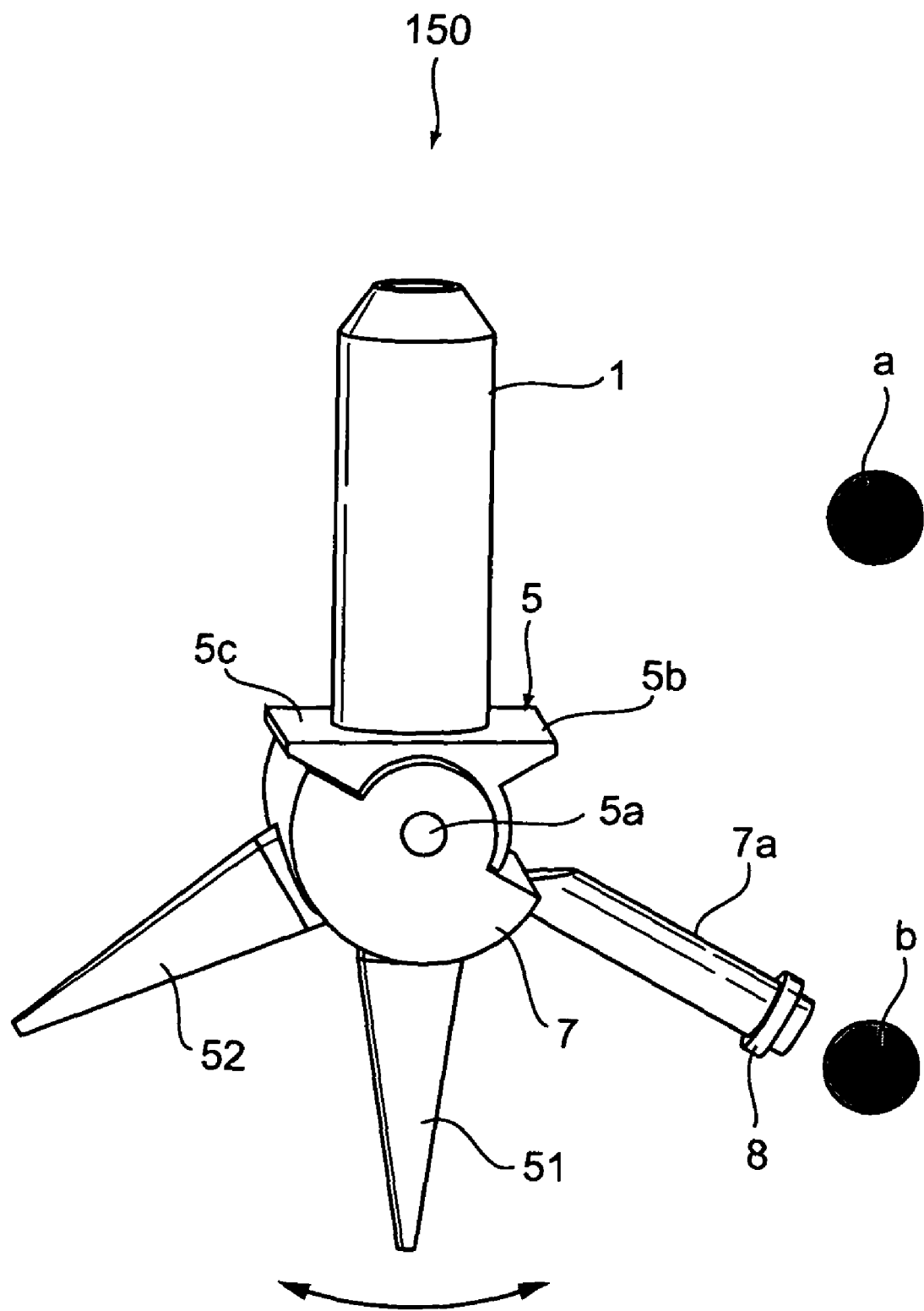
FIG. 23 is a perspective view of a nozzle unit according to an embodiment in which a rotating body is rotated two-dimensionally.
Figure 24:
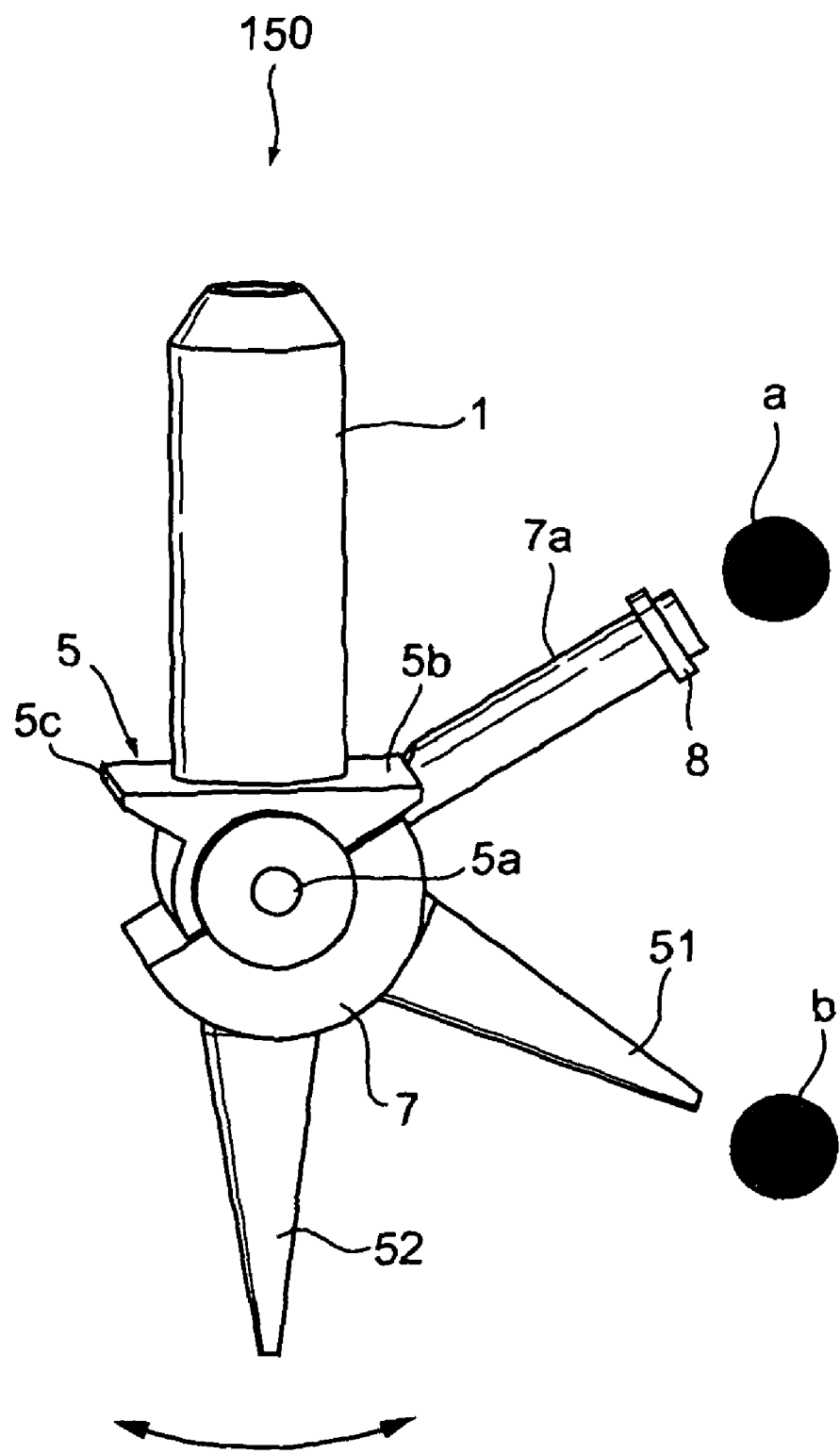
FIG. 24 is a perspective view of the nozzle unit shown in FIG. 23 seen from a different angle.

FIGS. 23 and 24 are perspective views of the nozzle unit according to another embodiment.

A nozzle unit 150 includes a spindle component 1, a rotary shaft member 5 connected to the spindle component 1, a rotating body 7 rotatably connected to the rotary shaft member 5, and two nozzles 51 and 52, for example, connected to the rotating body 7. The rotary shaft member 5 includes an internal space (not shown) that is in communication with an air passage inside the spindle component 1 and is connected to the rotating body 7 at a rotary-shaft portion 5a. The rotating body 7 includes a lever 7a, and a magnetic body 8 is attached to an end portion of the lever 7a. The rotating body 7 is driven as shown in FIGS. 23 and 24 by magnetic-field-generating-type driving sources a and b. Accordingly, the two nozzles 51 and 52 are switched selectively.

When the nozzle 51 (or 52) is selected by one of the driving sources a and b, the internal space of the rotary shaft member 5 comes into communication with one of openings (not shown) formed at positions respectively corresponding to the nozzles 51 and 52 in the rotating body 7.

Alternatively, the internal space of the rotary shaft member 5 may be in communication with both of the openings respectively corresponding to the nozzles 51 and 52 in both of the states shown in FIGS. 23 and 24. In this case, the nozzle 51 or 52 positioned in the vertical direction, that is, the selected nozzle 51 (or 52) comes closest to the electronic component 4 to hold the electronic component 4. Therefore, even when a negative pressure is generated in the other nozzle 52 (or 51), the electronic component 4 is not sucked by that other nozzle 52 (or 51).

The rotary shaft member 5 includes two engaging protrusions (stoppers) 5b and 5c that restrict a movement of the lever 7a by causing the lever member to rotate within a predetermined angle range within a plane of rotation of the lever 7a. Accordingly, positioning accuracy of the nozzles 51 and 52 can be improved.

Because the driving sources a and b can rotate the rotating body 7 in a non-contact state also in the nozzle unit 150 as described above, a mechanically complex mechanism is unnecessary and production of dust can be suppressed. Moreover, due to the non-contact driving method, a power source does not need to be provided to the rotating body 7, and electrical wiring or the like with respect to the rotating body 7 thus becomes unnecessary. In addition, since a power source does not need to be provided to the rotating body 7, the nozzle unit 150 becomes light, and a size reduction of the nozzle unit 150 can be realized.

Figure 25:
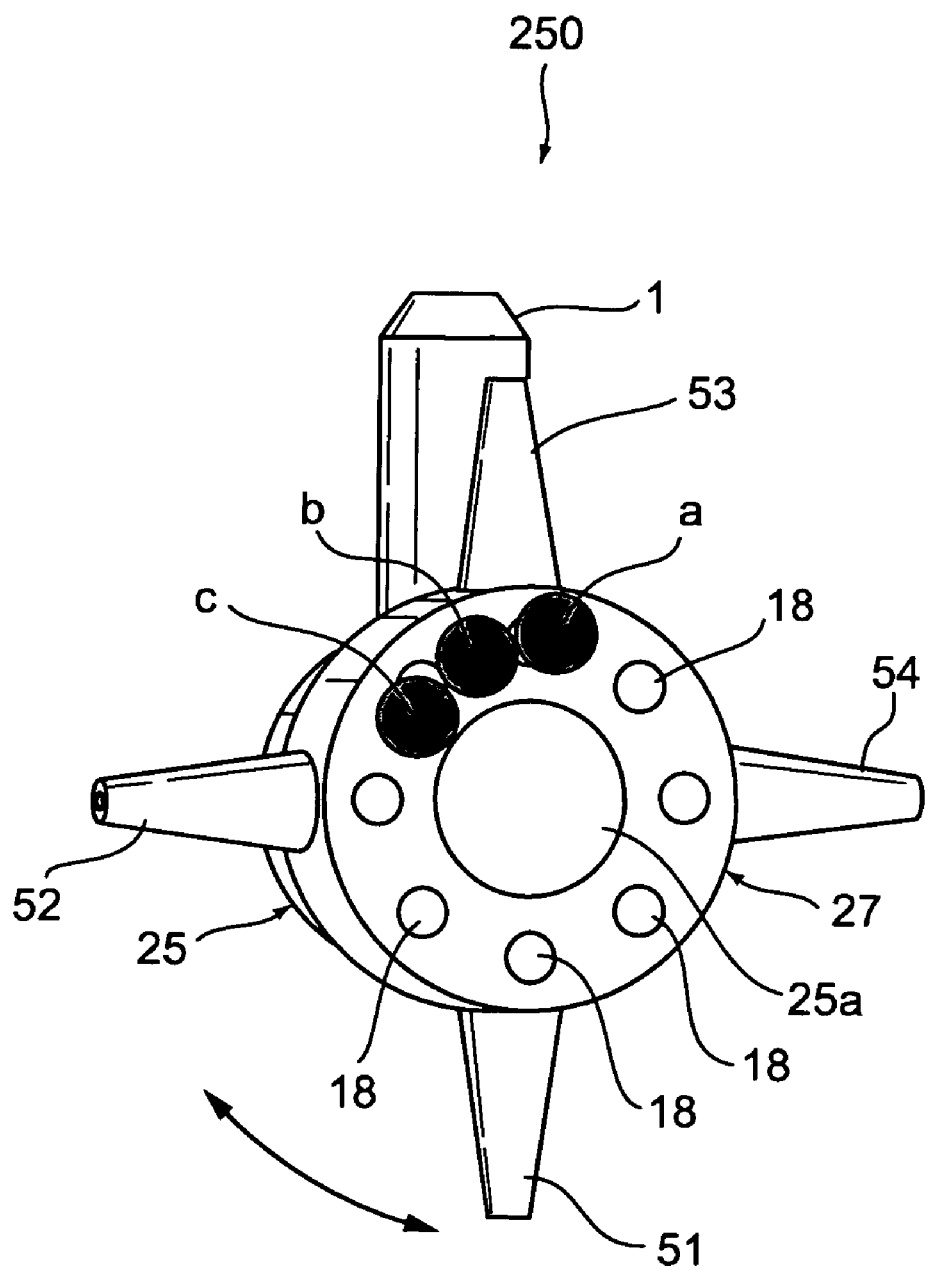
FIG. 25 is a perspective view of a nozzle unit according to another embodiment of the present invention in which a rotating body rotates two-dimensionally, the nozzle unit being seen from a front side.
Figure 26:
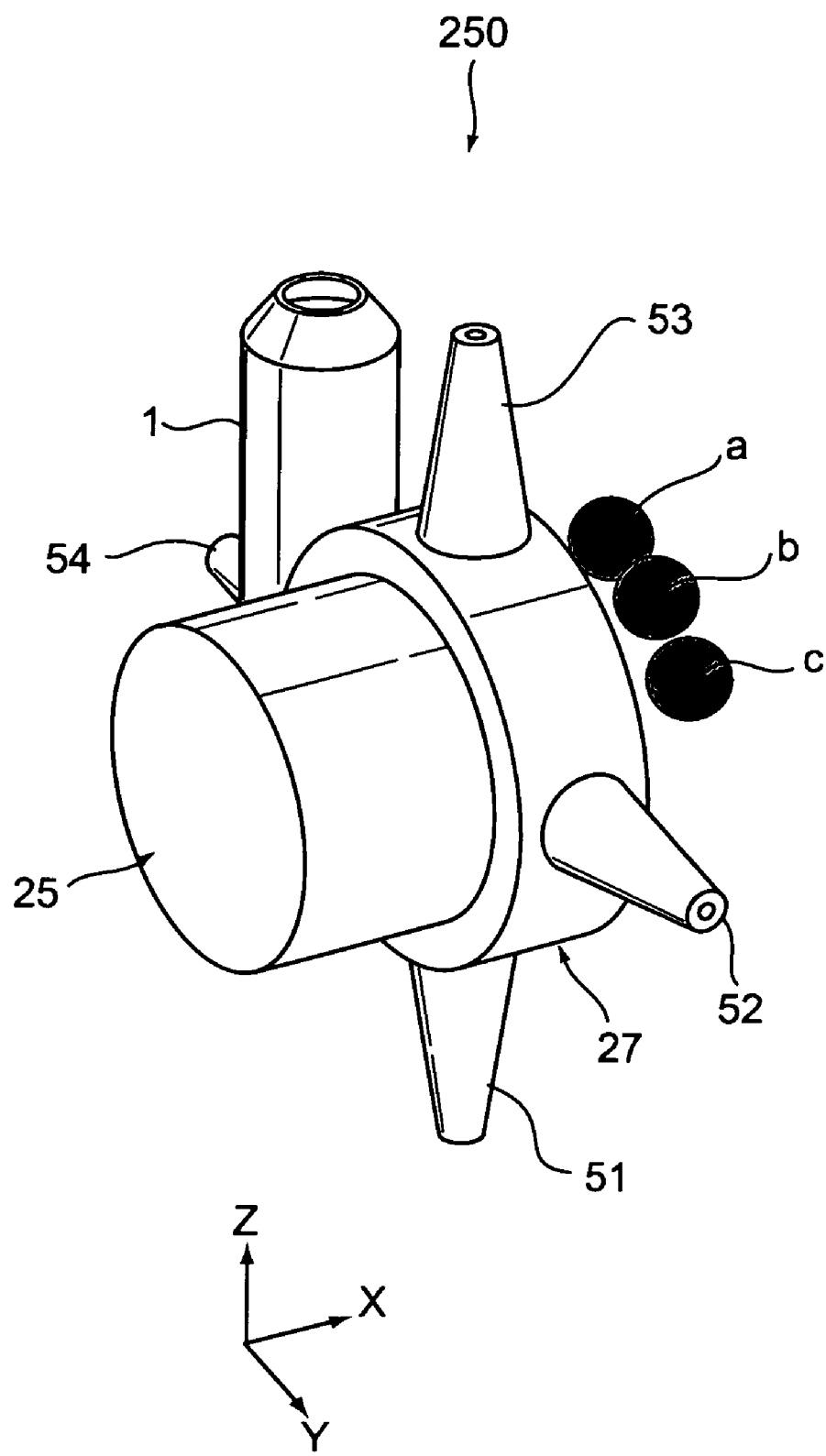
FIG. 26 is a perspective view of the nozzle unit shown in FIG. 25 seen from a back side.

FIG. 25 is a perspective view of a nozzle unit according to still another embodiment of the present invention in which a rotating body rotates two-dimensionally, the nozzle unit being seen from a front side. FIG. 26 is a perspective view of the nozzle unit seen from a back side.

In a nozzle unit 250, a circular rotating body 27 is rotatably connected to a rotary-shaft member 25. As shown in FIG. 25, provided to the rotating body 27 are magnetic bodies 18 disposed almost at regular intervals in a circumferential direction (rotational direction). Driving sources a to c rotate the rotating body 27 within a Y-Z plane by causing magnetic fields to act on the magnetic bodies 18, to thus selectively switch nozzles 51 to 54 connected to the rotating body 27.

The number of driving sources is not limited to three, and the way the driving sources a to c are arranged is also not limited to that shown in FIGS. 25 and 26. The number of nozzles is also not limited to four.

Figure 27:
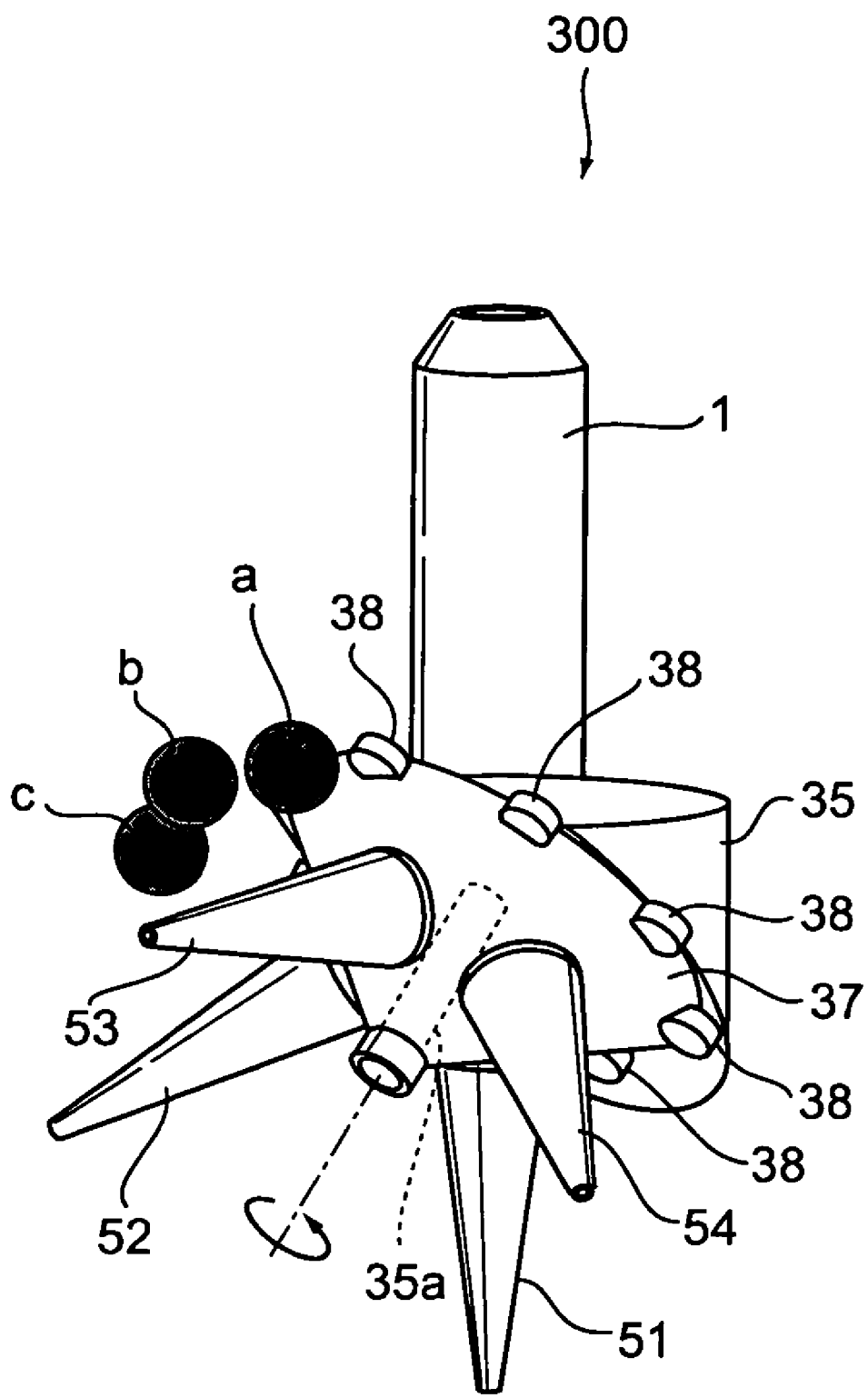
FIG. 27 is a perspective view of a nozzle unit according to still another embodiment of the present invention in which a rotating body rotates two-dimensionally.
Figure 28:
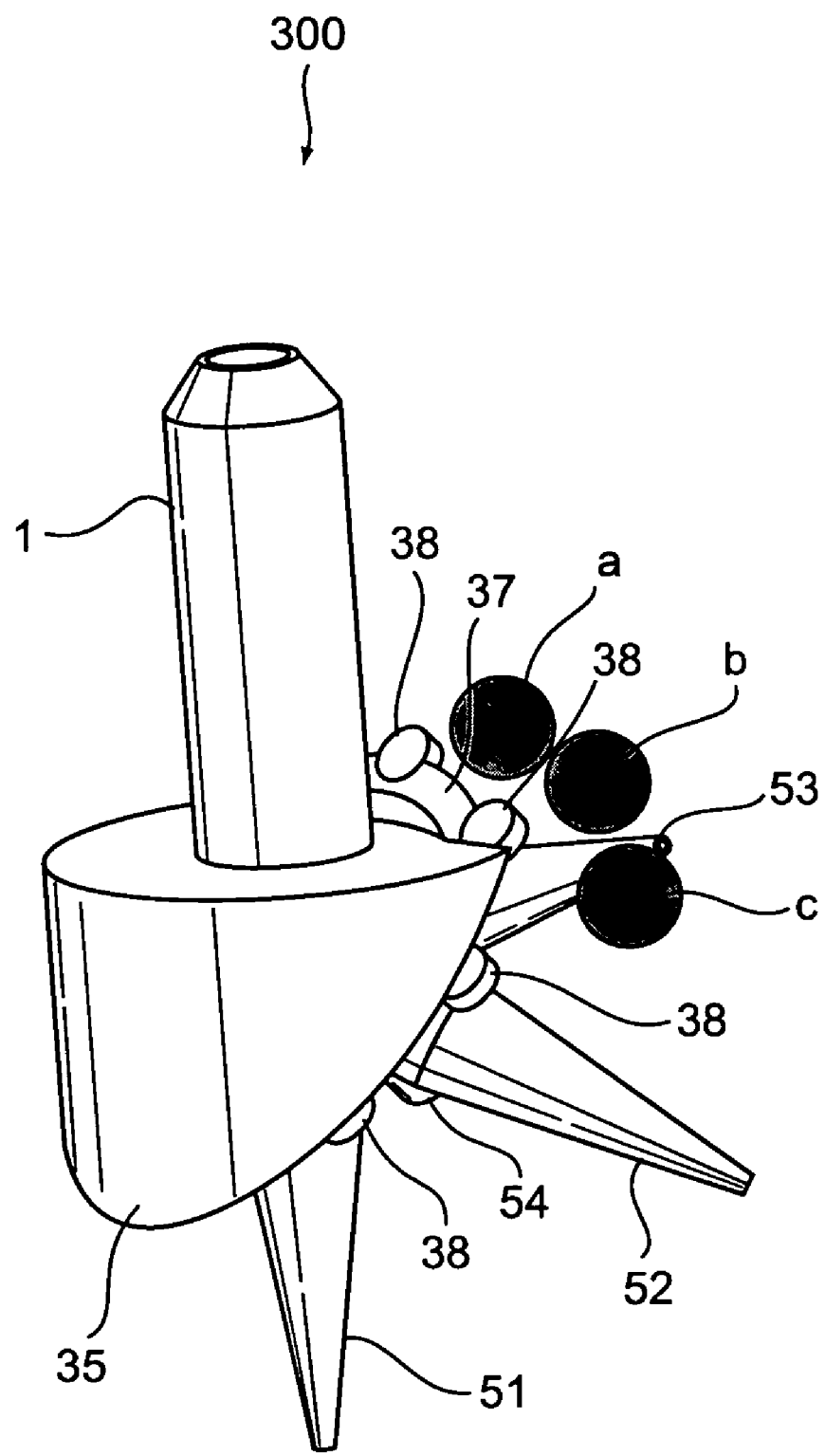
FIG. 28 is a perspective view of the nozzle unit shown in FIG. 27 seen from the back side.

FIG. 27 is a perspective view of a nozzle unit according to still another embodiment of the present invention in which a rotating body rotates two-dimensionally. FIG. 28 is a perspective view of the nozzle unit seen from a back side.

A nozzle unit 300 includes a conical rotating body 37 and a rotary-shaft member 35 that includes an oblique rotary-shaft portion 35a. The rotating body 37 is connected radially with, for example, four nozzles 51 to 54, and magnetic bodies 38 are provided almost at regular intervals on a circumference of the rotary-shaft portion 35a. Driving sources a to c rotate the rotating body 37 about the oblique rotary shaft so that the nozzles are switched selectively.

The number of driving sources is not limited to three, and the way the driving sources a to c are arranged is also not limited to that shown in FIGS. 27 and 28. The number of nozzles is also not limited to four.

Figure 29:
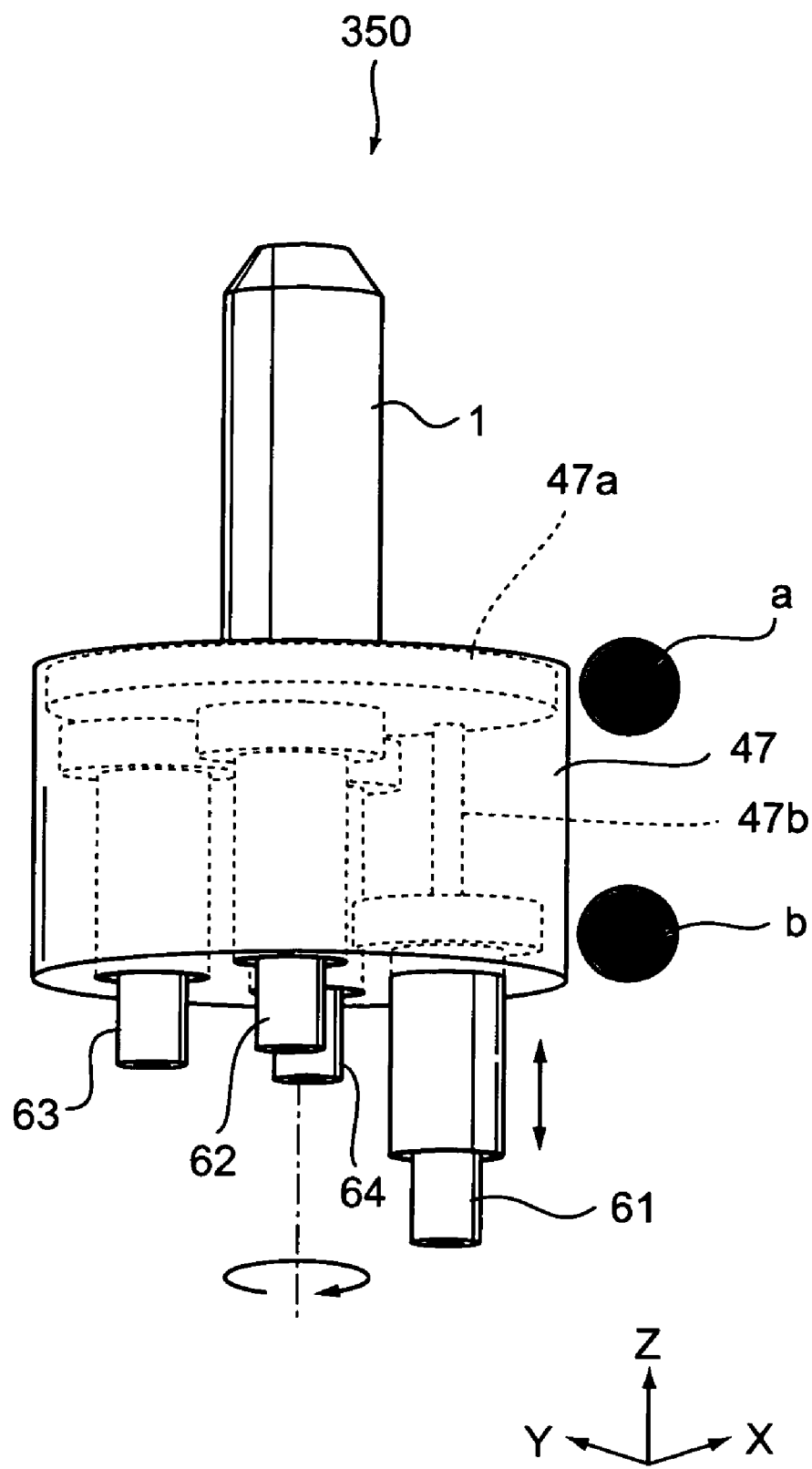
FIG. 29 is a perspective view of a nozzle unit according to an embodiment in which a plurality of nozzles are moved vertically, the nozzle unit being seen from a bottom side.

FIG. 29 is a perspective view of a nozzle unit according to an embodiment in which a plurality of nozzles are moved vertically, the nozzle unit being seen from a bottom side.

A nozzle unit 350 includes a rotating body (supporting portion) 47 that supports a plurality of nozzles 61 to 64, for example. The rotating body 47 is rotated by a motor (not shown) within a plane substantially perpendicular to a longitudinal direction of a spindle component 1, that is, an X-Y plane. Due to control of a rotation angle, one of the four nozzles 61 to 64 comes closest to driving sources a and b provided near a side surface of the rotating body 47 so that the nozzle is selected. A magnetic body (not shown) is attached to each of the nozzles 61 to 64 on a head portion side (upper side in Z direction), and the magnetic-field-generating-type driving sources a and b vertically drive the selected nozzle.

In the case of the nozzle unit 350 shown in FIG. 29, the rotating body 47 does not always need to be rotated and only needs to have a function of at least supporting the nozzles 61 to 64 so that the nozzles are driven vertically. Instead of a cylinder, the rotating body 47 may have a shape of a quadrangular prism, or may have other shapes. The number of nozzles and the number of driving sources are also not limited.

Provided inside the rotating body 47 at substantially the center is a buffer space 47a that is in communication with the air passage (not shown) provided inside the spindle component 1 and a passage 47b that is in communication with the inside of each of the nozzles 61 to 64. Accordingly, a negative pressure and a zero pressure (or negative pressure and positive pressure) are delivered to the nozzles 61 to 64.

An embodiment of the present invention is not limited to the embodiments described above, and various other embodiments may also be employed.

The nozzle unit 100 according to the embodiment described with reference to FIGS. 1 to 18 has had a structure in which the two shell members 110 and 120 respectively rotate about mutually-orthogonal shafts. However, as another nozzle unit, a structure in which a shell member that includes a plurality of nozzles is rotated by a spherical bearing may also be employed, for example.

Although a driving principle of the driving sources a to f, a to c, and the like according to the above embodiments has been described as using the magnetic system, the driving sources may be driven by a static system in a non-contact state.

In the embodiment described with reference to FIGS. 1 to 18, it is not always necessary to provide the lip seals 139 and 119 for enhancing airtightness inside the rotating body 3, the engaging protrusions 134a, 134b, 114a, and 114b for enhancing the movement restriction function of the rotating body 3, the sucking members 136, 116, and 127, and the like.

The above embodiments have described the example where the electronic component 4 is held using a negative pressure caused by air. Alternatively, an inert gas such as nitrogen or argon or other gases may be used instead of air.

The present application contains subject matter related to that disclosed in Japanese Priority Patent Application JP 2008-186332 filed in the Japan Patent Office on Jul. 17, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nozzle unit, comprising:
a rotating body that includes a plurality of nozzles for holding a component using a negative pressure and rotates the plurality of nozzles; and
a driving source disposed apart from the rotating body in non-contact relationship therewith and operative to drive the rotating body,
wherein the rotating body rotates the plurality of nozzles three-dimensionally and
wherein the rotating body includes
a first shaft,
a first shell member capable of rotating about the first shaft,
a second shaft in a direction different from that of the first shaft, and
a second shell member that includes the plurality of nozzles and is capable of rotating about the second shaft, the second shell member being provided such that the second shell member covers the first shell member.

2. The nozzle unit according to claim 1, further comprising:
a supplying channel for the negative pressure; and
a third shell member that includes a first opening for delivering the negative pressure to the first shell member and is connected to the supplying channel, the third shell member being provided such that the first shell member covers the third shell member,
wherein the first shell member includes a plurality of second openings to deliver the negative pressure to one of the plurality of nozzles of the second shell member by being switched selectively by the driving source so that one of the plurality of second openings faces the first opening.

3. The nozzle unit according to claim 2, further comprising
a sealing member provided for enhancing, when one of the plurality of second openings faces the first opening, airtightness between the first opening and the second opening.

4. The nozzle unit according to claim 2, further comprising
a sealing member provided for enhancing, when one of the plurality of second openings faces one of the plurality of nozzles, airtightness between the second opening and the nozzle.

5. The nozzle unit according to claim 1,
wherein the second shell member includes
a first driven portion driven by the driving source so that the second shell member rotates about the first shaft, and
a second driven portion driven by the driving source so that the second shell member rotates about the second shaft.

6. The nozzle unit according to claim 1,
wherein at least one of the first shell member and the second shell member includes a stopper to restrict, when the plurality of nozzles are positioned by the driving source, a relative movement of the first shell member and the second shell member.

7. The nozzle unit according to claim 6,
wherein the stopper is an engaging portion to engage the first shell member and the second shell member with each other.

8. The nozzle unit according to claim 7,
wherein the engaging portion includes
   a first engaging protrusion that is provided to the first shell member and extends in a direction of the first shaft, and
   an engaging groove that is provided to the second shell member and engages with the first engaging protrusion.

9. The nozzle unit according to claim 6,
wherein the stopper includes a magnetic body that causes a suction force to act on the first shell member and the second shell member.

10. The nozzle unit according to claim 1, further comprising:
   a supplying channel for the negative pressure; and
   a third shell member connected to the supplying channel and provided such that the first shell member covers the third shell member,
wherein at least one of the third shell member and the first shell member includes a stopper to restrict a movement of the first shell member with respect to the third shell member when the plurality of nozzles are positioned by the driving source.

11. The nozzle unit according to claim 10,
wherein the stopper is an engaging portion to engage the third shell member and the first shell member with each other.

12. The nozzle unit according to claim 10,
wherein the stopper includes a magnetic body that causes a suction force to act on the third shell member and the first shell member.

13. The nozzle unit according to claim 1,
wherein the driving source uses a-magnetism to drive the rotating body in the non-contact relationship.

14. The nozzle unit according to claim 13,
wherein the rotating body includes a magnetic body, and
wherein the driving source drives the rotating body by causing a magnetic field that acts on the magnetic body.

15. The nozzle unit according to claim 1,
wherein the rotating body rotates the plurality of nozzles two-dimensionally.

* * * * *